United States Patent
Lo et al.

(10) Patent No.: US 7,709,886 B2
(45) Date of Patent: May 4, 2010

(54) THIN FILM TRANSISTOR AND PIXEL STRUCTURE

(75) Inventors: Wei-Hsiang Lo, Hsinchu (TW); Hao-Chieh Lee, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 232 days.

(21) Appl. No.: 11/949,781

(22) Filed: Dec. 4, 2007

(65) Prior Publication Data

US 2008/0277721 A1 Nov. 13, 2008

(30) Foreign Application Priority Data

May 10, 2007 (TW) .............................. 96116613 A

(51) Int. Cl.
 *H01L 27/12* (2006.01)
 *H01L 21/336* (2006.01)
 *H01L 29/786* (2006.01)

(52) U.S. Cl. .......... 257/329; 257/E21.41; 257/E27.111; 257/E27.112; 257/E29.137; 257/E29.262; 257/E29.274; 257/E31.04; 257/E31.041; 257/E27.131; 257/E29.151; 438/156

(58) Field of Classification Search .................. 257/60, 257/E31.04, E31.041, E27.131, E29.151
See application file for complete search history.

(56) References Cited

U.S. PATENT DOCUMENTS

| 6,383,860 B2 * | 5/2002 | Maeda et al. ............... 438/239 |
| 6,548,856 B1 | 4/2003 | Lin et al. |
| 6,569,715 B1 | 5/2003 | Forbes |

* cited by examiner

*Primary Examiner*—Matthew E Warren
*Assistant Examiner*—David Spalla
(74) *Attorney, Agent, or Firm*—Jianq Chyun IP Office

(57) ABSTRACT

A fabricating method of a TFT includes first forming a source on a substrate. Then, a first insulation pattern layer is formed to cover parts of the source and the substrate. The first insulation pattern layer has an opening exposing a part of the source. Thereafter, a gate pattern layer is formed on the first insulation pattern layer. Then, the gate pattern layer and a second insulation pattern layer formed thereon surround the opening. Moreover, a second lateral protection wall is formed on an edge of the gate pattern layer in the opening. Afterwards, a channel layer is formed in the opening and covers the second lateral protection wall and the source. Then, a passivation layer with a contact window is formed on the channel layer and the second insulation pattern layer to expose a portion of the channel layer. Thereafter, a drain is formed on the exposed channel layer.

11 Claims, 23 Drawing Sheets

US 7,709,886 B2

THIN FILM TRANSISTOR AND PIXEL STRUCTURE

CROSS-REFERENCE TO RELATED APPLICATION

This application claims the priority benefit of Taiwan application serial no. 96116613, filed on May 10, 2007. The entirety of the above-mentioned patent application is hereby incorporated by reference herein and made a part of this specification.

BACKGROUND OF THE INVENTION

1. Field of the Invention

The present invention generally relates to an active device, a pixel structure and a fabricating method thereof. More particularly, the present invention relates to a thin film transistor (TFT), a pixel structure having a high aperture ratio and a fabricating method thereof.

2. Description of Related Art

Nowadays, a multimedia technology has been well developed, which mostly benefits from the development of semiconductor devices and display apparatuses. As for displays, LCDs with the advantages such as high definition, favorable space utilization, low power consumption and non-radiation have gradually become the mainstream of the market.

In general, the LCD mainly includes an active device array substrate, a color filter substrate, and a liquid crystal layer sandwiched between the two substrates. FIG. 1A is a schematic view of a conventional active device array substrate, while FIG. 1B is a cross-sectional schematic view along line A-A' in FIG. 1A. Referring to FIGS. 1A and 1B, a conventional active device array substrate 100 mainly includes a substrate 102, a plurality of scan lines 104, a plurality of data lines 106 and a plurality of pixel structures P1 (only one pixel structure P1 is depicted in FIG. 1A). The scan lines 104, the data lines 106 and the pixel structure P1 are all disposed on the substrate 102, and the pixel structure P1 is electrically connected to the scan line 104 and the data line 106.

In detail, the pixel structure P1 is mainly constituted by an active device 110 and a pixel electrode 120. The pixel electrode 120 may be electrically connected to the active device 110 through a contact window C1. It is known from FIG. 1B that the conventional active device 110 has a bottom gate structure and mainly includes a gate $110g$, a gate insulating layer $110i$, a channel layer $110c$, an ohmic contact layer $110m$, a source $110s$ and a drain $110d$. In addition, a passivation layer 112 covers the active device 110 and has the contact window C1 exposing a part of the drain $110d$. Thus, the pixel electrode 120 disposed on the passivation layer 112 may be electrically connected to the drain $110d$ through the contact window C1. During an actual operation, the active device 110 may be turned on by switching signals transmitted through the scan lines 104. After the active device 110 is turned on, display signals may be transmitted to the pixel electrode 120 through the data lines 106.

It should be noted that conductivity performance of the active device 110 is positively correlated to a length L and a width W of the channel layer $110c$. To improve the conductivity performance of the active device 110, the length L and the width W of the channel layer $110c$ are increased, thus increasing the area occupied by the active device 110 on the substrate 102 and further reducing the aperture ratio of the pixel structure P1.

SUMMARY OF THE INVENTION

In view of the foregoing, the present invention is directed to a fabricating method of a TFT. The method is able to manufacture the TFT having favorable device properties.

The present invention is directed to a TFT having favorable device properties.

The present invention is directed to a fabricating method of a pixel structure. The method is capable of manufacturing the pixel structure having a high aperture ratio.

The present invention is directed to a pixel structure to resolve an issue regarding unfavorable aperture ratio of the conventional pixel structure.

Based on the above, the present invention provides a fabricating method of a TFT. The fabricating method includes the following steps. First, a substrate is provided, and a source is formed thereon. Then, a first insulation pattern layer is formed to cover parts of the source and the substrate. The first insulation pattern layer has a covering layer and a first lateral protection wall. The first lateral protection wall extends on the substrate at two sides of the source, and the covering layer covers a part of the source. In addition, the covering layer and the first lateral protection wall together form an opening exposing a part of the source. Thereafter, a gate pattern layer and a second insulation pattern layer are sequentially formed on the first insulation pattern layer, and the gate pattern layer and the second insulation pattern layer surround the opening. Next, a second lateral protection wall is formed on an edge of the gate pattern layer in the opening. Afterwards, a channel layer is formed in the opening and covers the second lateral protection wall and the source. After that, a passivation layer is formed on the channel layer and the second insulation pattern layer. The passivation layer has a contact window to expose a portion of the channel layer. Eternally, a drain is formed on the exposed portion of the channel layer.

According to an embodiment of the present invention, a first ohmic contact layer is further formed on the source when the source is formed.

According to an embodiment of the present invention, a second ohmic contact layer is further formed on the exposed surface of the channel layer after the passivation layer is formed.

According to an embodiment of the present invention, the step of forming the second ohmic contact layer includes the following steps. First, a doping process is performed on the exposed surface of the channel layer with use of the passivation layer as a mask. Next, an annealing process is carried out on the channel layer to form the second ohmic contact layer.

According to an embodiment of the present invention, the gate pattern layer and the second insulation pattern layer are formed together.

According to an embodiment of the present invention, a thickness of the first insulation pattern layer extending on the substrate at the two sides of the source is decreased in a direction away from the source.

According to an embodiment of the present invention, a thickness of the second lateral protection wall is decreased in a direction towards a center of the opening.

The present invention further provides a TFT disposed on a substrate. The TFT of the present invention includes a source, a first insulation pattern layer, a gate pattern layer, a second insulation pattern layer, a second lateral protection wall, a channel layer, a passivation layer and a drain. The source is disposed on the substrate, and the first insulation pattern layer covers parts of the source and the substrate. The first insulation pattern layer has a covering layer and a first lateral protection wall. The first lateral protection wall extends on the substrate at two sides of the source, and the covering layer covers a part of the source. In addition, the covering layer and the first lateral protection wall surround and define an opening exposing a part of the source. Besides, the gate pattern layer and the second insulation pattern layer are sequentially disposed on the gate pattern layer, and the gate pattern layer and the second insulation pattern layer surround the opening and expose a part of the source. The second lateral protection wall surrounds the inside of the opening and covers an edge of the gate pattern layer, and the channel layer is disposed on the second lateral protection wall and the source in the opening. The passivation layer is disposed on the channel layer and the second insulation pattern layer, and the passivation layer has a contact window to expose a portion of the channel layer. The drain is disposed on the exposed portion of the channel layer.

According to an embodiment of the present invention, the TFT further includes a first ohmic contact layer disposed between the source and the channel layer.

According to an embodiment of the present invention, the TFT further includes a second ohmic contact layer disposed between the channel layer and the drain.

According to an embodiment of the present invention, a thickness of the first insulation pattern layer on the substrate at the two sides of the source is decreased in a direction away from the source.

According to an embodiment of the present invention, a thickness of the second lateral protection wall is decreased in a direction towards a center of the opening.

The present invention further provides a fabricating method of a pixel structure. The fabricating method includes the following steps. First, a substrate is provided, and a source is formed thereon. Then, a first insulation pattern layer is formed to cover parts of the source and the substrate. The first insulation pattern layer has a covering layer and a first lateral protection wall. The first lateral protection wall extends on the substrate at two sides of the source, and the covering layer covers a part of the source. In addition, the covering layer and the first lateral protection wall surround an opening exposing a part of the source. Thereafter, a gate pattern layer and a second insulation pattern layer are sequentially formed on the first insulation pattern layer to cover the gate pattern layer and the substrate, and the gate pattern layer and the second insulation pattern layer surround the opening. Next, a second lateral protection wall is formed at least on an edge of the gate pattern layer in the opening. Afterwards, a channel layer is formed in the opening to cover the second lateral protection wall and the source. A passivation layer is then formed on the channel layer and the second insulation pattern layer, and the passivation layer has a contact window to expose a portion of the channel layer. Eternally, a pixel electrode is formed on the passivation layer, and a drain is formed in the contact window. The pixel electrode is electrically connected to the drain.

According to an embodiment of the present invention, the material of the pixel electrode and the drain includes indium tin oxide (ITO) or indium zinc oxide (IZO).

According to an embodiment of the present invention, a first ohmic contact layer is further formed on the source when the source is formed.

According to an embodiment of the present invention, a second ohmic contact layer is further formed on the exposed surface of the channel layer after the passivation layer is formed.

According to an embodiment of the present invention, the step of forming the second ohmic contact layer includes the following steps. First, a doping process is performed on the exposed surface of the channel layer with use of the passivation layer as a mask. Next, an annealing process is carried out on the channel layer to form the second ohmic contact layer.

According to an embodiment of the present invention, a thickness of the first insulation pattern layer extending on the substrate at the two sides of the source is decreased in a direction away from the source.

According to an embodiment of the present invention, a thickness of the second lateral protection wall is decreased in a direction towards a center of the opening.

According to an embodiment of the present invention, a data line electrically connected to the source is further formed on the substrate when the source is formed.

According to an embodiment of the present invention, a scan line electrically connected to the gate pattern layer is further formed on the substrate when the gate pattern layer is formed.

The present invention further provides a pixel structure disposed on a substrate. The pixel structure of the present invention includes a source, a first insulation pattern layer, a gate pattern layer, a second insulation pattern layer, a second lateral protection wall, a channel layer, a passivation layer, a pixel electrode and a drain. The source is disposed on the substrate, and the first insulation pattern layer covers parts of the source and the substrate. The first insulation pattern layer has a covering layer and a first lateral protection wall. The first lateral protection wall extends on the substrate at two sides of the source, and the covering layer covers a part of the source. In addition, the covering layer and the first lateral protection wall surround and define an opening exposing a part of the source. Additionally, the gate pattern layer and the second insulation pattern layer are sequentially disposed on the first insulation pattern layer, and the gate pattern layer and the second insulation pattern layer surround the opening. Moreover, the second lateral protection wall is disposed on an edge of the gate pattern layer in the opening. The channel layer is disposed on the second lateral protection wall and the source in the opening. The passivation layer is disposed on the channel layer and the second insulation pattern layer, and the passivation layer has a contact window to expose a portion of the channel layer. The pixel electrode and the drain are disposed on the passivation layer and in the contact window, respectively. The pixel electrode is electrically connected to the drain, and the drain is electrically connected to the channel layer.

According to an embodiment of the present invention, the pixel structure further includes a first ohmic contact layer which is at least disposed between the source and the channel layer.

According to an embodiment of the present invention, the pixel structure further includes a second ohmic contact layer which is disposed between the channel layer and the drain.

According to an embodiment of the present invention, a thickness of the first insulation pattern layer extending on the substrate at the two sides of the source is decreased in a direction away from the source.

According to an embodiment of the present invention, a thickness of the second lateral protection wall is decreased in a direction towards a center of the opening.

According to an embodiment of the present invention, the pixel structure further includes a data line disposed on the substrate and electrically connected to the source.

According to an embodiment of the present invention, the pixel structure further includes a scan line disposed on the substrate and electrically connected to the gate pattern layer.

According to the fabricating methods of the TFT and the pixel structure, a length of the channel layer on the second lateral protection wall is changed through monitoring the thicknesses of the gate and the second insulation layer. Accordingly, through a proper adjustment of the length of the channel layer, the TFT of the present invention can be characterized by desirable conductivity without occupying additional area on the substrate. Moreover, the aperture ratio of the pixel structure proposed in the present invention may be improved effectively.

In order to the make the aforementioned and other objects, features and advantages of the present invention comprehensible, several embodiments accompanied with figures are described in detail below.

DESCRIPTION OF EMBODIMENTS

First Embodiment

Figure 1A:
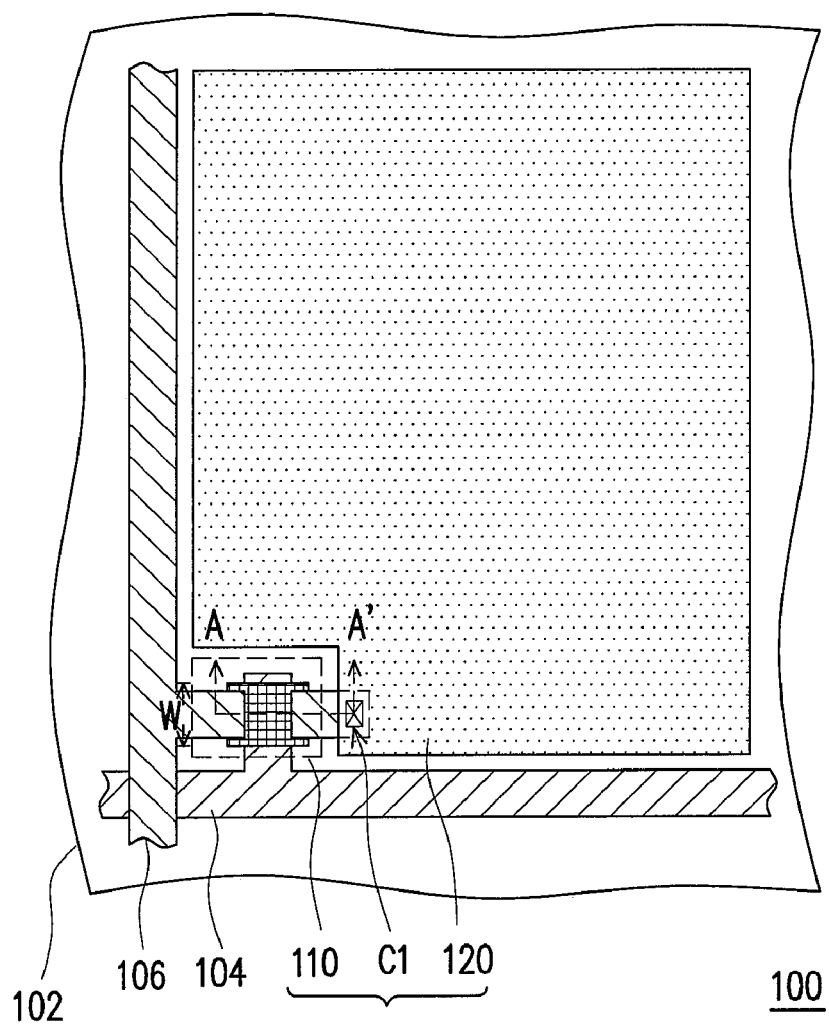
FIG. 1A is a schematic view of a conventional active device array substrate.
Figure 1B:
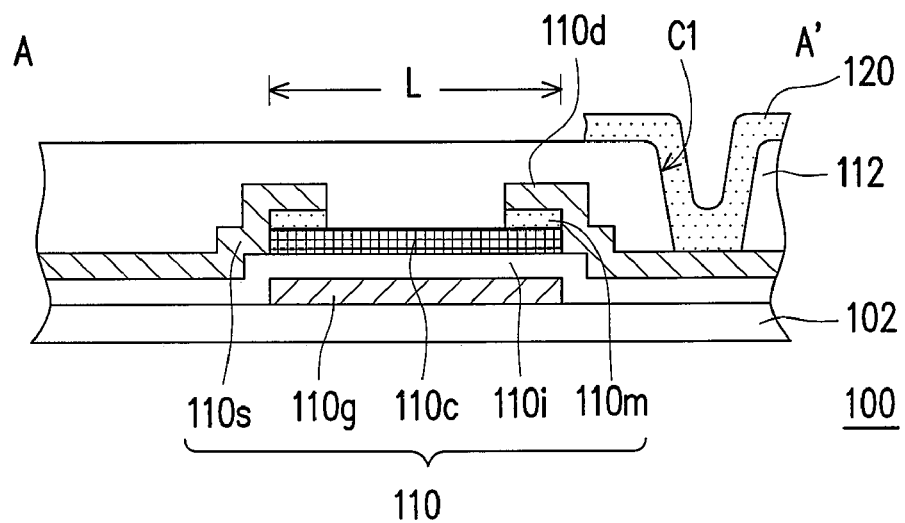
FIG. 1B is a cross-sectional schematic view along line A-A' in FIG. 1A.
Figure 2A:
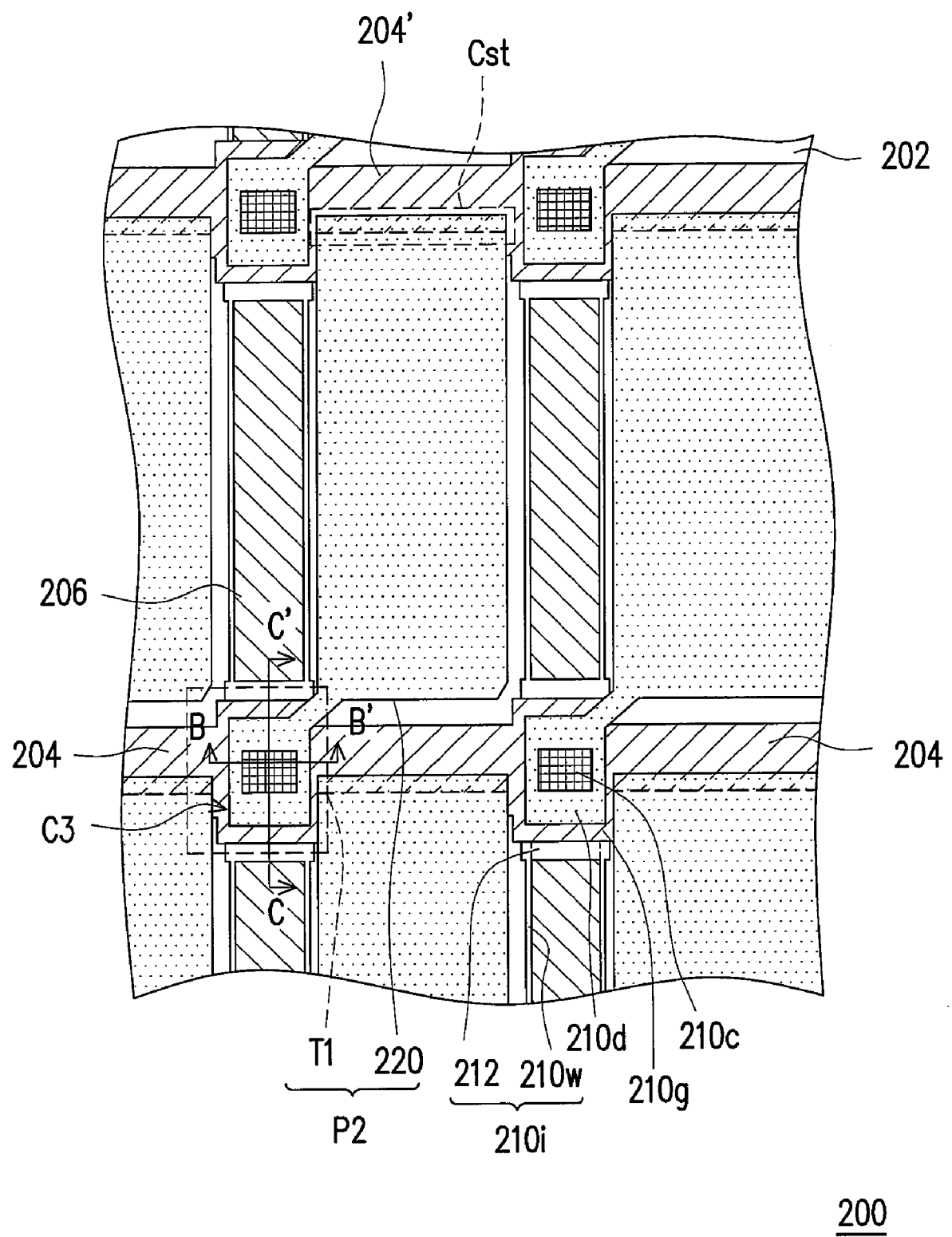
FIG. 2A is a schematic view of a pixel structure according to an embodiment of the present invention.
Figure 2B:
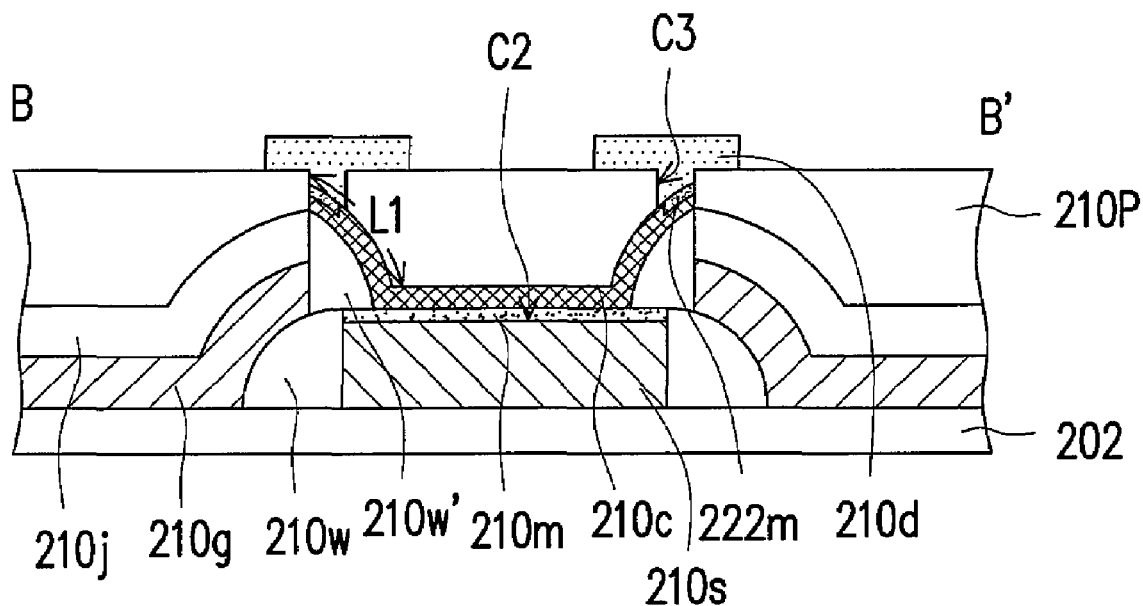
FIG. 2B is a cross-sectional schematic view along line B-B' in FIG. 2A.

FIG. 2A is a schematic view of a pixel structure according to a first embodiment of the present invention. FIG. 2B is a cross-sectional schematic view along line B-B' in FIG. 2A. Referring to FIGS. 2A and 2B, according to the embodiment of the present invention, the active device array substrate 200 mainly includes a substrate 202, a plurality of scan lines 204, a plurality of data lines 206 and a plurality of pixel structures P2. The pixel structure P2 array is formed on the substrate 202, and the scan lines 204 and the data lines 206 can define the positions where the pixel structures P2 are located. Specifically, one of the pixel structures P2 mainly includes a TFT T1 and a pixel electrode 220. It is known from FIG. 2A that the scan lines 204 and the data lines 206 may be electrically connected to the pixel electrode 220 through the TFT T1. During an actual operation, the TFT T1 may be turned on by switching signals transmitted through the scan lines 204. After the TFT T1 is turned on, display signals may be transmitted to the pixel electrode 220 through the data lines 206.

According to an embodiment of the present invention, the TFT T1 includes a source 210s, a first insulation pattern layer 210i, a gate pattern layer 210g, a second insulation pattern layer 210j, a second lateral protection wall 210w', a channel layer 210c, a passivation layer 210p and a drain 210d. The source 210s is disposed on the substrate 202 and is electrically connected to the data lines 206. In general, the material of the source 210s may include aluminum, copper, gold, silver, chromium, titanium, tungsten, tantalum, or other conductive materials.

In addition, the first insulation pattern layer 210i covers parts of the source 210s and the substrate 202. The first insulation pattern layer 210i has a covering layer 212 and a first lateral protection wall 210w. As illustrated in FIG. 2A, the first lateral protection wall 210w extends on the substrate 202 at two sides of the source 210s. Besides, it is indicated in FIG. 2B that a thickness of the first lateral protection wall 210w is decreased in a direction away from the source 210s. Said arrangement allows film layers subsequently formed on the first lateral protection wall 210w to have desired step coverage. In a preferred embodiment, a height of the first lateral protection wall 210w approximately ranges from 3000 angstrom to 6000 angstrom, and the height may be equal to or slightly larger than a height of the first ohmic contact layer 210m. The first lateral protection wall 210w may be in other profiles. The profile provided herein is exemplary, and the present invention is not intended to limit the profile of the first lateral protection wall 210w.

Figure 2C:
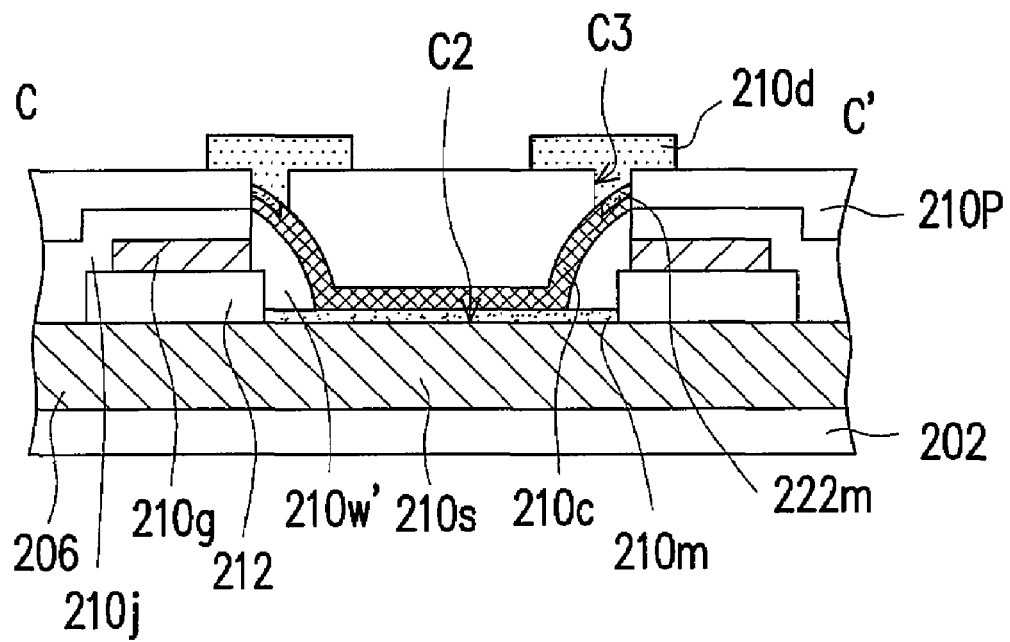
FIG. 2C is a cross-sectional schematic view along line C-C' in FIG. 2C.

FIG. 2C is a cross-sectional schematic view along line C-C' in FIG. 2A. Referring to FIGS. 2A and 2C, the covering layer 212 covers a part of the source 210s, and the covering layer 212 and the first lateral protection wall 210w may together surround and define an opening C2 exposing a part of the source 210s. In a preferred embodiment, the first ohmic contact layer 210m may be further sandwiched between the source 210s and the channel layer 210c in order to reduce the contact resistance between the channel layer 210c (a semiconductor material) and the source 210s (a metal material).

Please refer to FIGS. 2A and 2B. According to an embodiment of the present invention, the gate pattern layer 210g is disposed on the first insulation pattern layer 210i, while the second insulation pattern layer 210j is disposed on the gate pattern layer 210g. Note that the second insulation pattern layer 210j is not depicted in FIG. 2A for the purpose of better illustration and comprehension. In particular, the gate pattern layer 210g may be electrically connected to the scan lines 204 on the substrate 202. In addition, the gate pattern layer 210g and the second insulation pattern layer 210j disposed thereon may together surround the opening C2.

According to an embodiment of the present invention, the second lateral protection wall 210w' is disposed on an edge of the gate pattern layer 210g in the opening C2. As shown in FIG. 2B, a thickness of the second lateral protection wall 210w' is decreased in a direction towards a center of the opening C2, and a surface of the second lateral protection wall 210w' is in an arc shape. Said arrangement allows the channel layer 210c subsequently formed on the second lateral protection wall 210w' to have desired step coverage. On the other hand, the gate pattern layer 210g is electrically insulated from the channel layer 210c through the second lateral protection wall 210w'. In a preferred embodiment, a height of the second lateral protection wall 210w' approximately ranges from 6000 angstrom to 10000 angstrom. The second lateral protection wall 210w' may also be in other profiles. The present invention is not intended to limit the profile of the second lateral protection wall 210w'.

According to an embodiment of the present invention, the channel layer 210c is disposed over the second lateral protection wall 210w' and the source 210s in the opening C2. A deposition thickness of the gate pattern layer 210g and the second insulation pattern layer 210j may pose an influence on the thickness of the second lateral protection wall 210w'. Accordingly, a length L1 of the channel layer 210c may be shortened if the film thicknesses of the gate pattern layer 210g and the second insulation pattern layer 210j are reduced. Thereby, the conductivity of the TFT T1 may be effectively improved. Moreover, the channel layer 210c may extend upwards through the second insulation pattern layer 210j. Thus, it is not necessary for the channel layer 210c to occupy additional area of the substrate 202, and the aperture ratio of the pixel structures P2 may be increased.

In addition, the passivation layer 210p covers the channel layer 210c and the second insulation pattern layer 2110j. The passivation layer 210p has a contact window C3 to expose a portion of the channel layer 210c; Besides, the drain 210d and the pixel electrode 220 are disposed on the passivation layer 210p and in the contact window C3, respectively. In a preferred embodiment, a second ohmic contact layer 220m may be further sandwiched between the channel layer 210c and the drain 210d in order to reduce the contact resistance between the channel layer 210c and the drain 210d disposed thereon.

According to an embodiment of the present invention, the drain 210d in the contact window C3 may be electrically connected to the channel layer 210c, and the pixel electrode 220 and the drain 210d are identical film layers. The material of the pixel electrode 220 and the drain 210d may be ITO or IZO.

The fabricating method of the pixel structure P2 and the TFT T1 thereof in the present invention is provided in detail hereinafter.

FIGS. 3A through 3F are top views illustrating a fabricating process of a pixel structure according to a first embodiment of the present invention. FIGS. 4A through 4G are cross-sectional schematic views illustrating the fabricating process of the pixel structure according to the first embodiment of the present invention. Please refer to FIGS. 3A and 4A. First, a substrate 202 is provided, and a source 210s is formed thereon. In a preferred embodiment, a data line 206 electrically connected to the source 210s is formed together with the source 210s through the same masking process using the same photomask process.

According to a preferred embodiment, the source 210s and the data line 206 may deposit metal materials on the substrate 202 through implementing a physical vapor deposition (PVD) process. Next, the metal material is patterned through carrying out the masking process, and the fabrication of the source 210s and the data line 206 is completed. According to an embodiment of the present invention, a first ohmic contact layer 210m is further formed on the source 210s when the source 210s is formed, so as to reduce the contact resistance between the source 210s and a subsequently formed channel layer. For example, the material of the first ohmic contact layer 210m may be an N-type doped amorphous silicon.

Figure 3A:
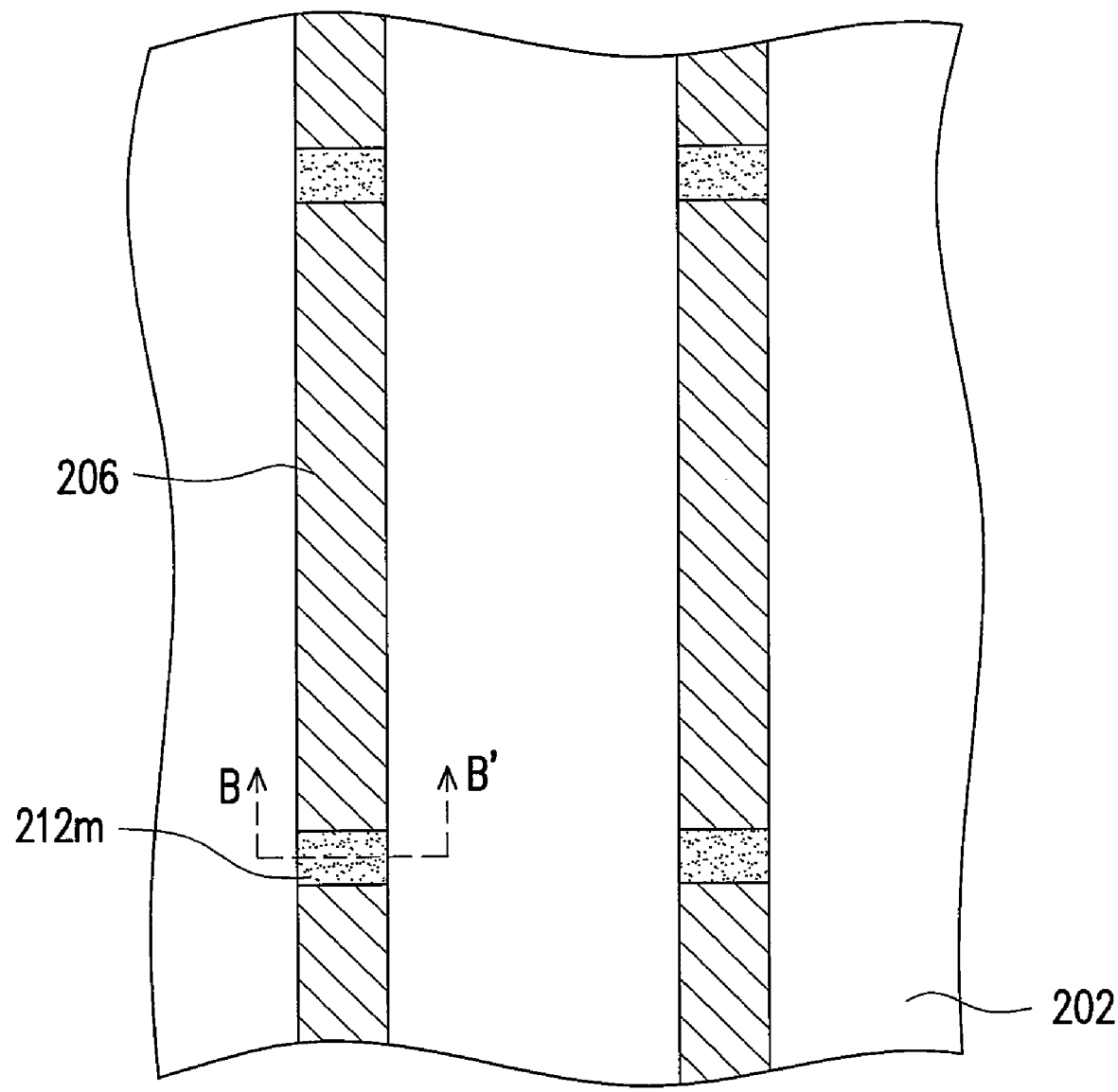
FIGS. 3A through 3F are top views illustrating a fabricating process of a pixel structure according to a first embodiment of the present invention.
Figure 3B:
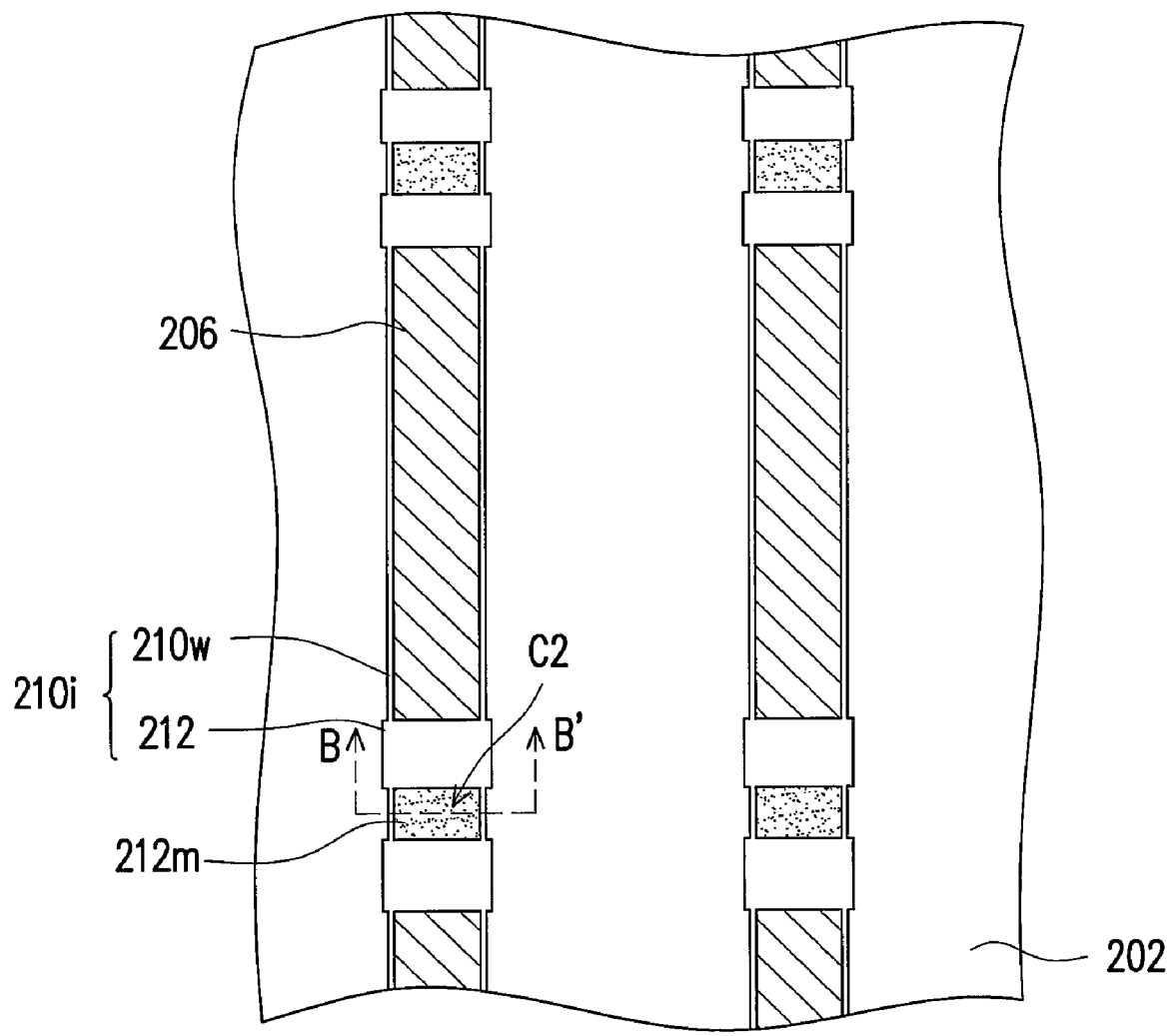
Figure 4A:
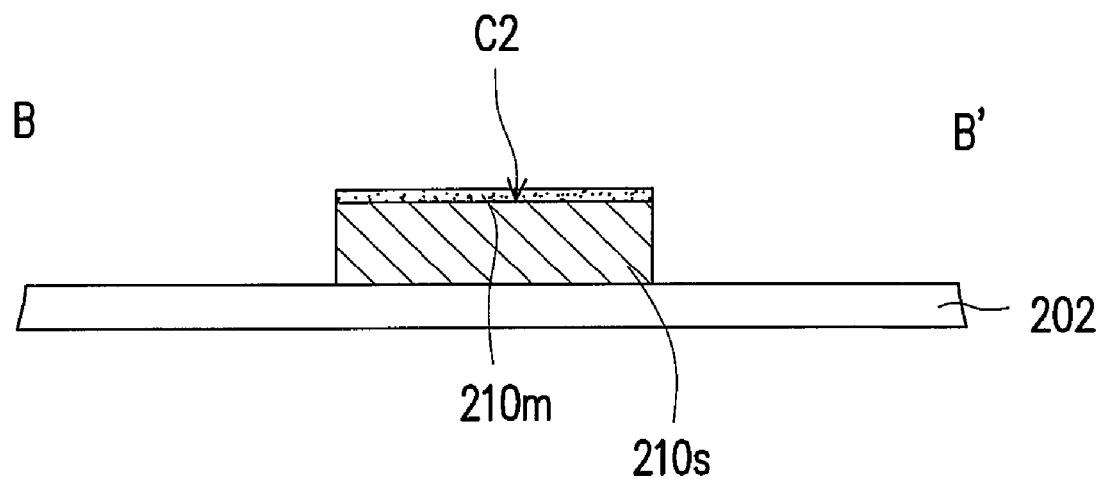
FIGS. 4A through 4G are cross-sectional schematic views illustrating the fabricating process of the pixel structure according to the first embodiment of the present invention.
Figure 4B:
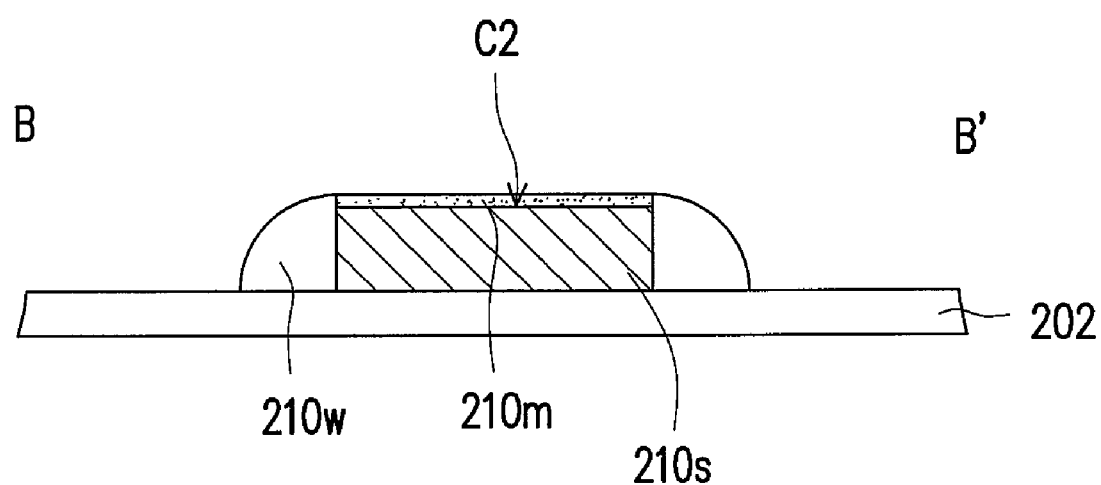

Referring to FIGS. 3B and 4B, a first insulation pattern layer 210i is then formed to cover parts of the source 210s and the substrate 202. In detail, the first insulation pattern layer 210i has a covering layer 212 and a first lateral protection wall 210w. The first lateral protection wall 210w extends on the substrate 202 at two sides of the source 210s, and the covering layer 212 covers a part of the source 210s. It should be noted that the covering layer 212 and the first lateral protection wall 210w may surround and define an opening C2 above the source 210s.

The material of the first insulation pattern layer 210i may be selected from silicon nitride (SiN), silicon oxide (SiO) formed by using tetra-ethyl-ortho-silicate (TEOS) as a reactive gas, or other similar materials. As the first insulation pattern layer 210i is formed, a thickness of the first lateral protection wall 210w is decreased in a direction away from the source 210s (as shown in FIG. 4B) by adjusting etching conditions (e.g. etching time) in the patterning process. According to a preferred embodiment, the first lateral protection wall 210w is formed by patterning the film layer (SiN or SiO) through performing an anisotropic etching. At appropriate etching time, pressure and temperature, the first lateral protection wall 210w can be formed in a desired profile. Said arrangement allows film layers subsequently formed on the first lateral protection wall 210w to have desired step coverage. The first lateral protection wall 210w may also be in other profiles. The present invention is not intended to limit the profile of the first lateral protection wall 210w'.

Figure 3C:
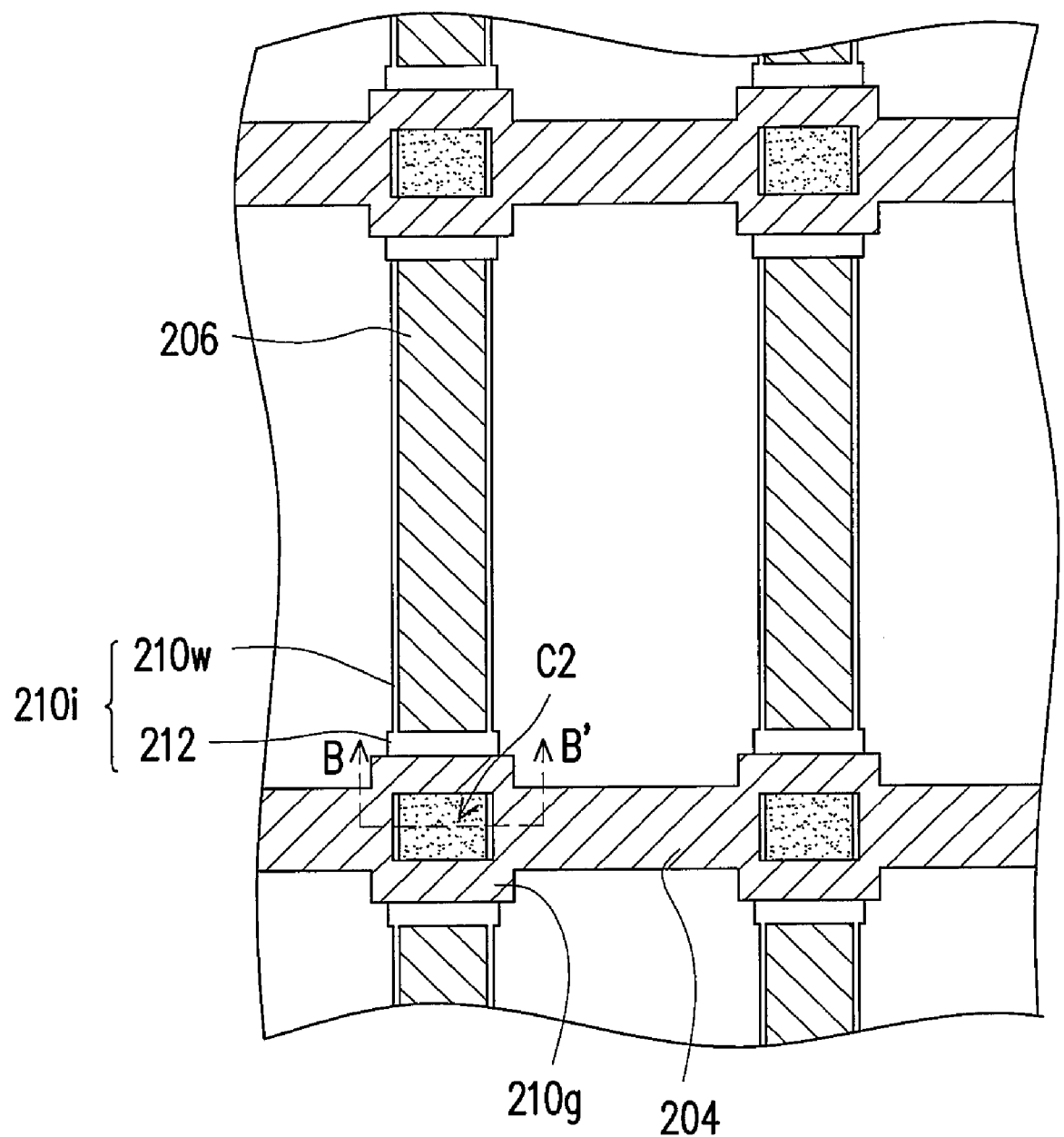
Figure 4C:
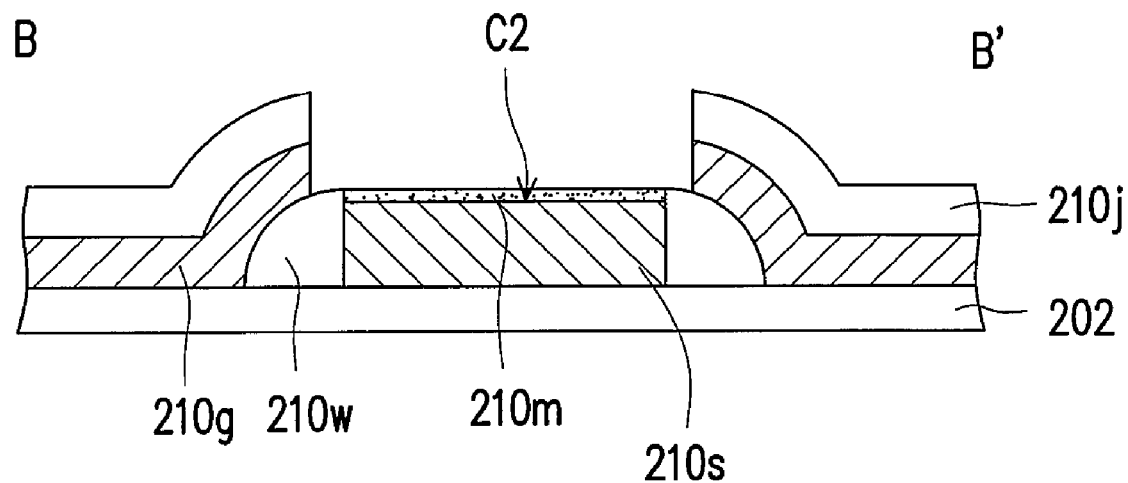

Referring to FIGS. 3C and 4C, a gate pattern layer 210g is formed on the first insulation pattern layer 210i, and the gate pattern layer 210g surrounds the opening C2. The profile of the gate pattern layer 210g may be properly modified based on actual demands, as long as the gate pattern layer 210g is able to surround the opening C2. According to a preferred embodiment, a scan line 204 electrically connected to the gate pattern layer 210g may be formed together with the gate pattern layer 210g through the same masking process using the same photomask. For example, the gate pattern layer 210g and the scan line 204 may deposit the metal materials onto the substrate 202 through implementing the PVD process. Next, the metal material is patterned through carrying out the masking process with use of one photomask, and the fabrication of the gate pattern layer 210g and the scan line 204 is completed.

Thereafter, a second insulation pattern layer 210j is formed to cover the gate pattern layer 210g and the substrate 202. As shown in FIG. 4C, the gate pattern layer 210g and the second insulation pattern layer 210j disposed thereon may together surround the opening C2. The second insulation pattern layer 210j is not depicted in FIG. 3C for the purpose of better illustration and comprehension.

Figure 3D:
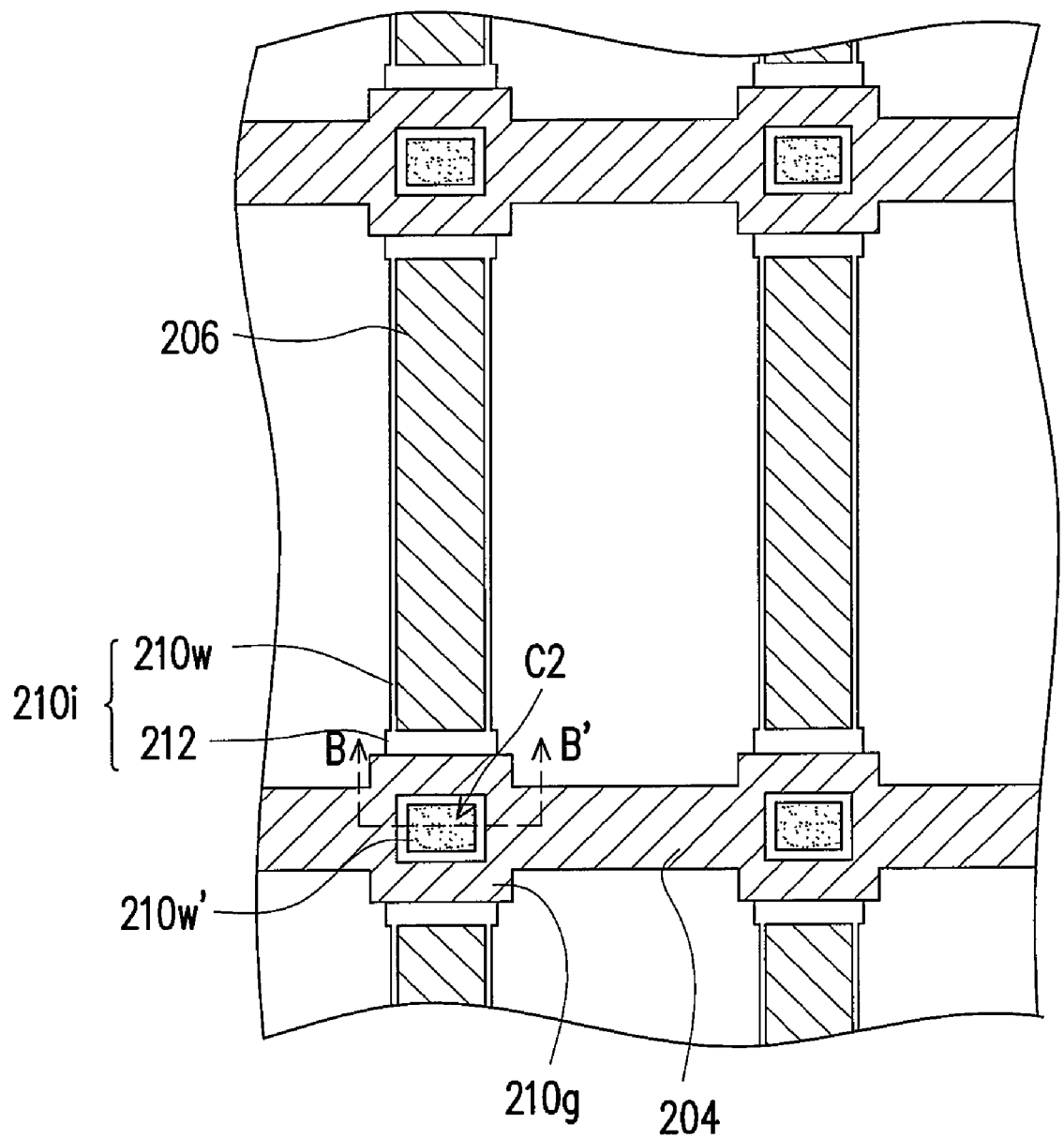
Figure 4D:
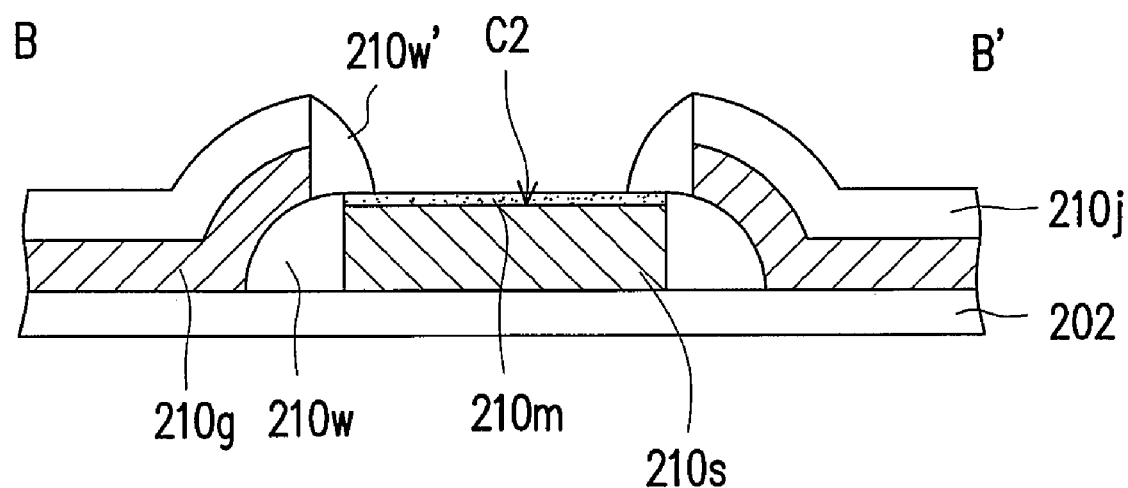

With reference to FIGS. 3D and 4D, at least a second lateral protection wall 210w' is formed on an edge of the gate pattern layer 210g in the opening C2. Particularly, as the second lateral protection wall 210w' is formed, a thickness of the second lateral protection wall 210w' is decreased in a direction towards a center of the opening C2 by adjusting the etching conditions (e.g. the etching time) in the patterning process. Said arrangement allows film layers subsequently formed on the second lateral protection wall 210w' to have desired step coverage. The second lateral protection wall 210w' may also be in other profiles. The present invention is not intended to limit the profile of the second lateral protection wall 210w'.

Figure 3E:
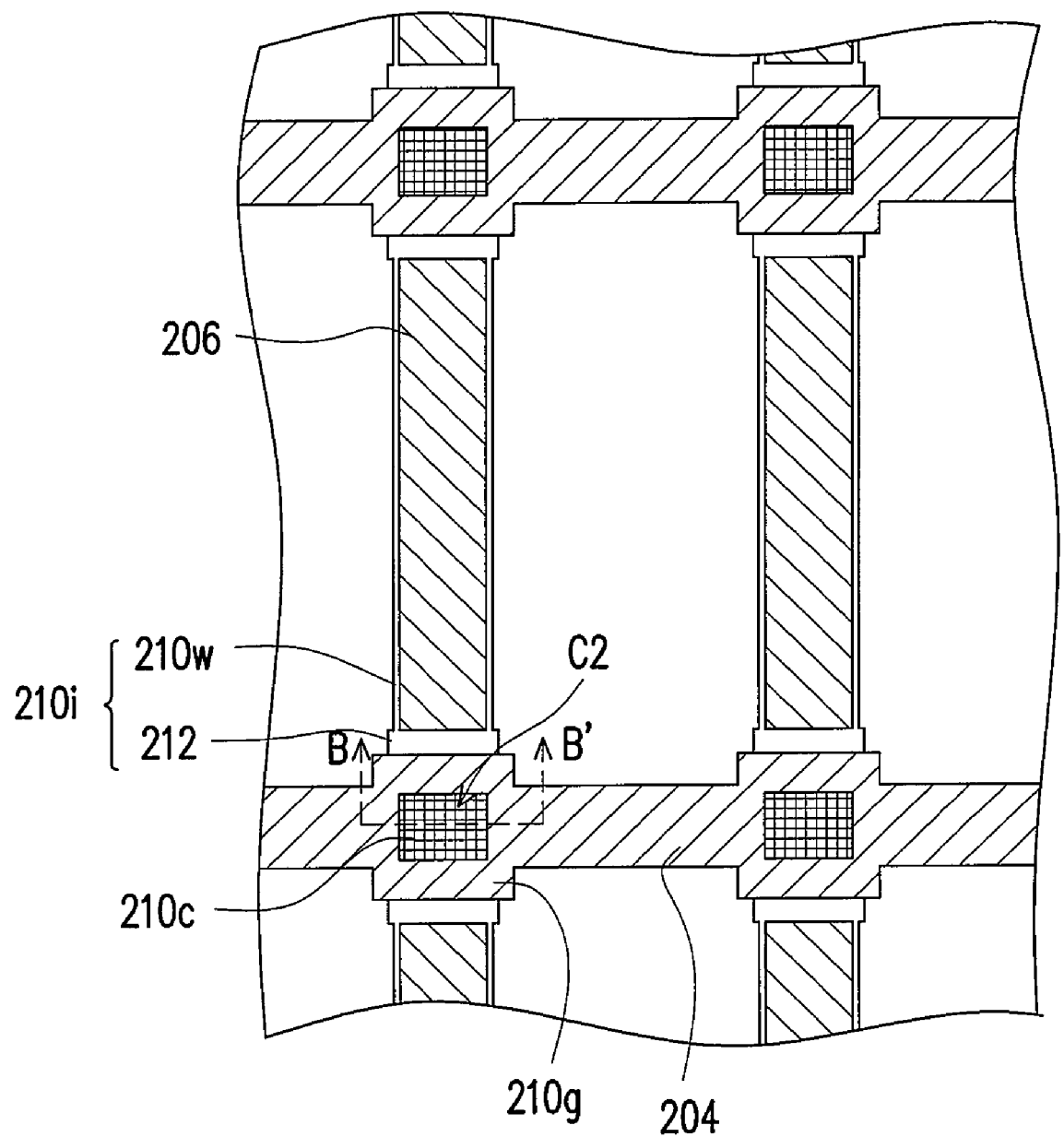
Figure 4E:
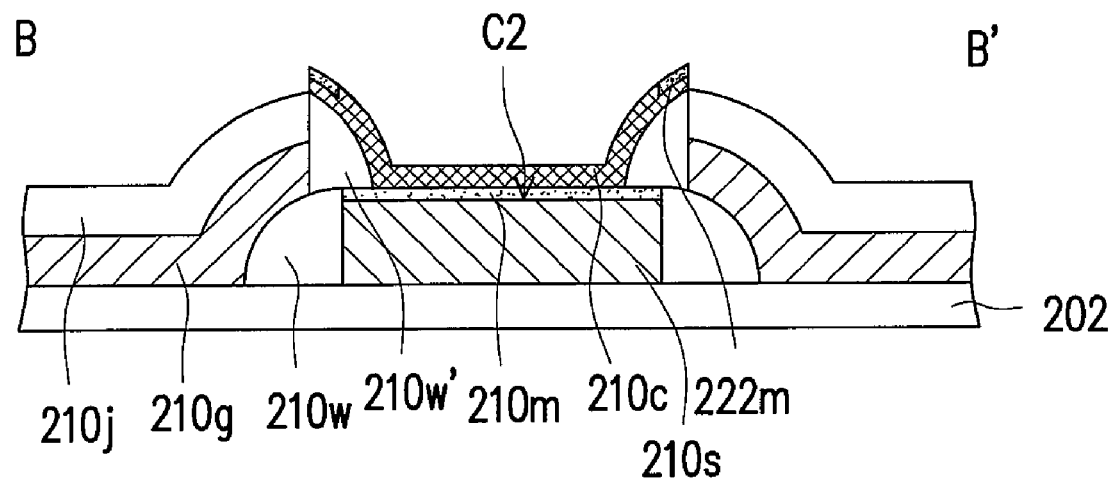

Referring to FIGS. 3E and 4E, a channel layer 210c is then formed in the opening C2 to cover the second lateral protection wall 210w' and a portion of the first ohmic contact layer 210m. It should be noted that the channel layer 210c may extend upwards through the second lateral protection wall 210w', and thus no additional area on the substrate 202 is occupied. On the other hand, as long as the thicknesses of the gate 210g and the second insulation pattern layer 210i are well monitored, the length L1 of the channel layer 210c can be effectively controlled.

Figure 4F:
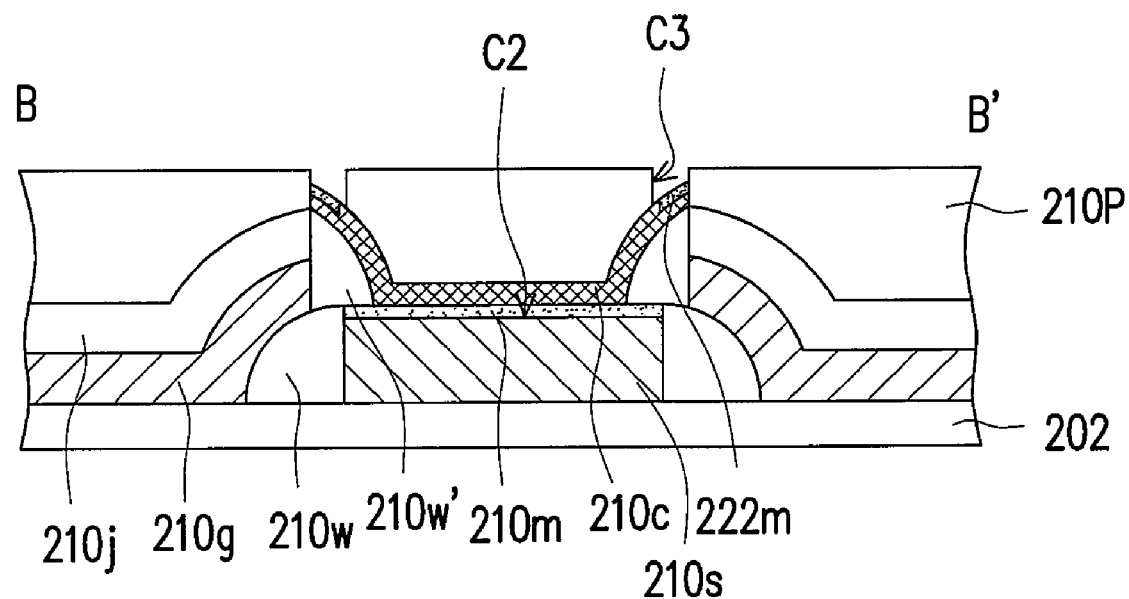

With reference to FIG. 4F, one passivation layer 210p is then formed on the channel layer 210c and the second insulation pattern layer 210j. The passivation layer 210p has a contact window C3 to expose a portion of the channel layer 210c. According to a preferred embodiment, one second ohmic contact layer 222m may be further formed on the exposed surface of the channel layer 210c after the passivation layer 210p is formed. In detail, the step of forming the second ohmic contact layer 222m includes performing a doping process on the exposed surface of the channel layer 210c with use of the passivation layer 210p as a mask. Next, an annealing process is carried out on the channel layer 210c to form the second ohmic contact layer 222m.

Figure 3F:
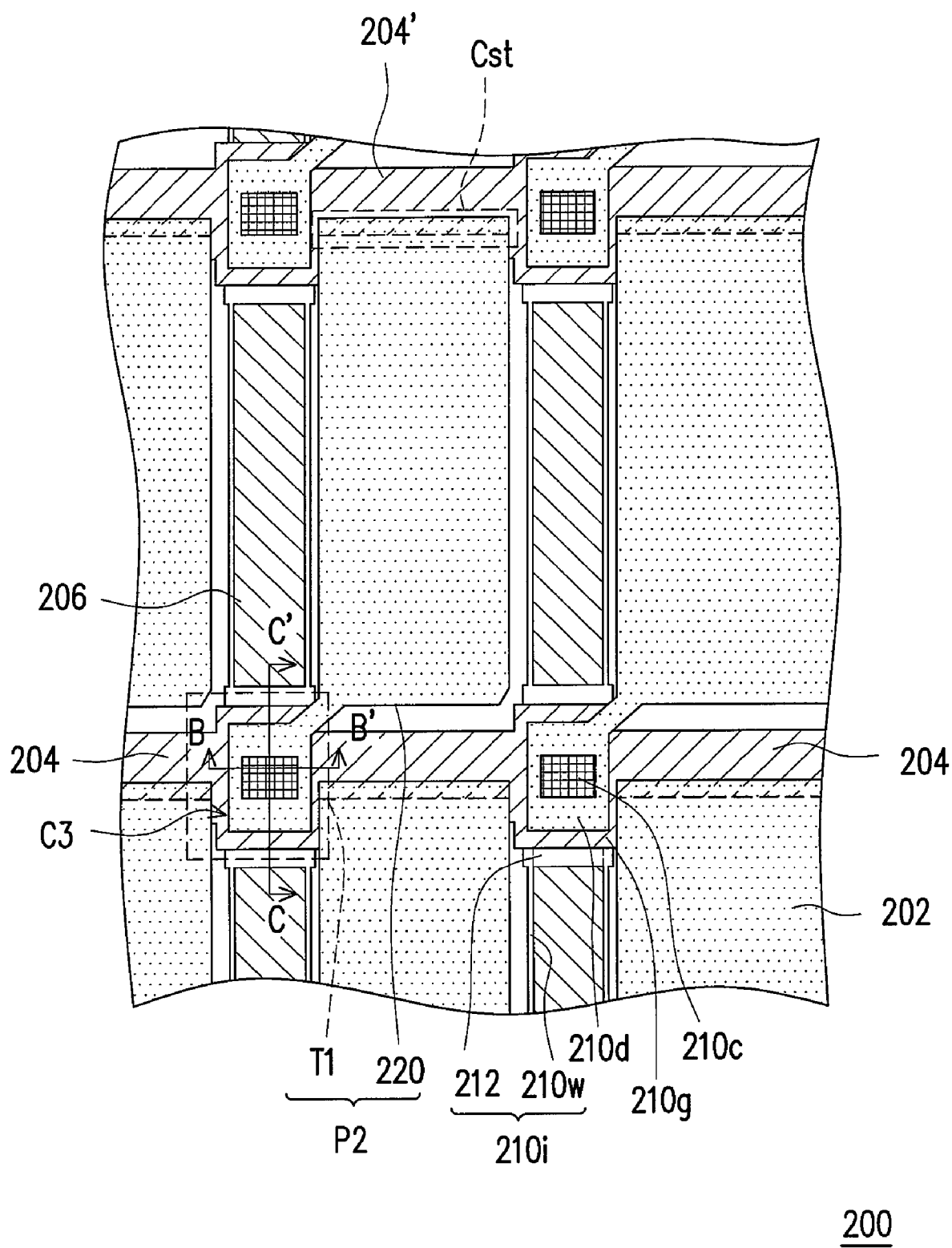
Figure 4G:
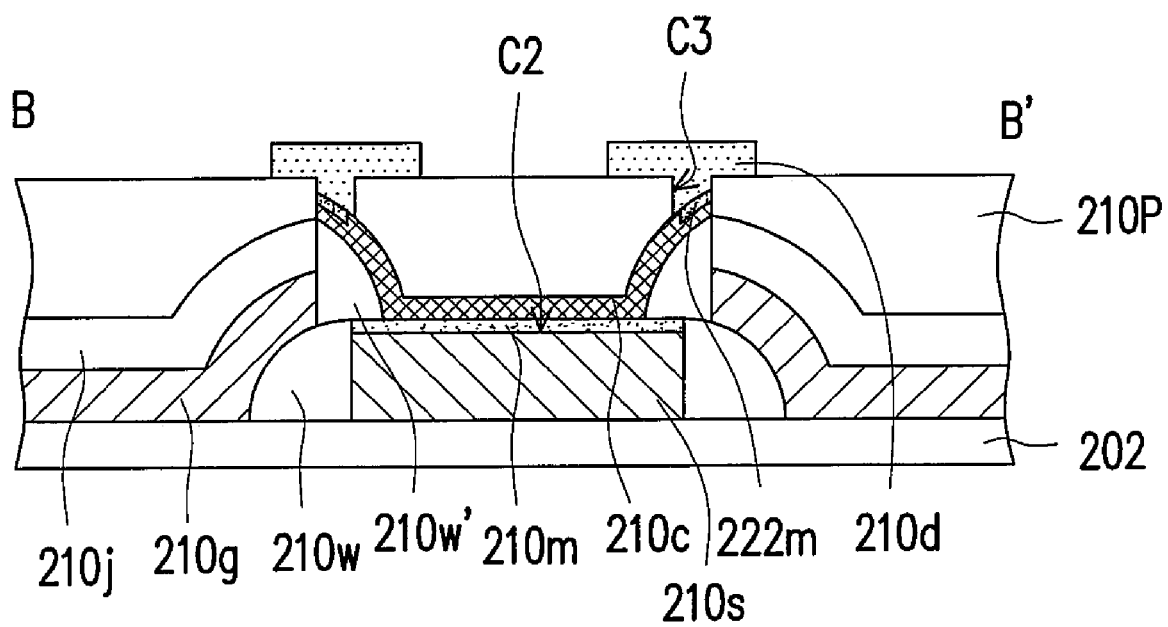

After that, referring to FIGS. 3F and 4G, a pixel electrode 220 is formed on the passivation layer 210p, and a drain 210d is formed in the contact window C3 (the passivation layer 210p is not illustrated in FIG. 3F, while the passivation layer 210p is clearly indicated in FIG. 4G). Specifically, a transparent conductive material can be deposited on the passivation layer 210p at first, and the transparent conductive material may be filled into the contact window C3. According to a preferred embodiment, the transparent conductive material may includes ITO or IZO. Thereafter, a masking process with use of one photomask is performed on the transparent conductive material to form the pixel electrode 220 and the drain 210d together. The pixel electrode 220 is electrically connected to the drain 210d. Note that a part of the pixel electrode 220 may extend above a previous scan line 204', so as to form a storage capacitor Cst along with a part of the scan line 204'. The above embodiment exemplifies the fabricating method of the pixel structure P2 and the TFT T1 thereof according to the present invention. Those who are skilled in the art may think of other embodiments incorporated by said disclosure.

The TFT of the present invention is a vertical-channel TFT, and thus the channel length limitation posed on other lateral-channel TFTs is not applied to the TFT of the present invention. According to the above-mentioned fabricating process, the length of the channel layer in the vertical-channel TFT may be adjusted with respect to the thicknesses of the gate pattern layer and the second insulation layer correspondingly. In other words, the length of the channel layer is apt to be monitored through adjusting the thickness of the second lateral protection wall. Accordingly, the TFT may have an improved capability of conducting driving currents.

Second Embodiment

To further enhance the conductivity performance of the TFT in the present invention, the gate pattern layer corresponds to the channel layer to a greater extent through adjusting profiles of the gate pattern layer and the channel layer according to the present embodiment.

Figure 5A:
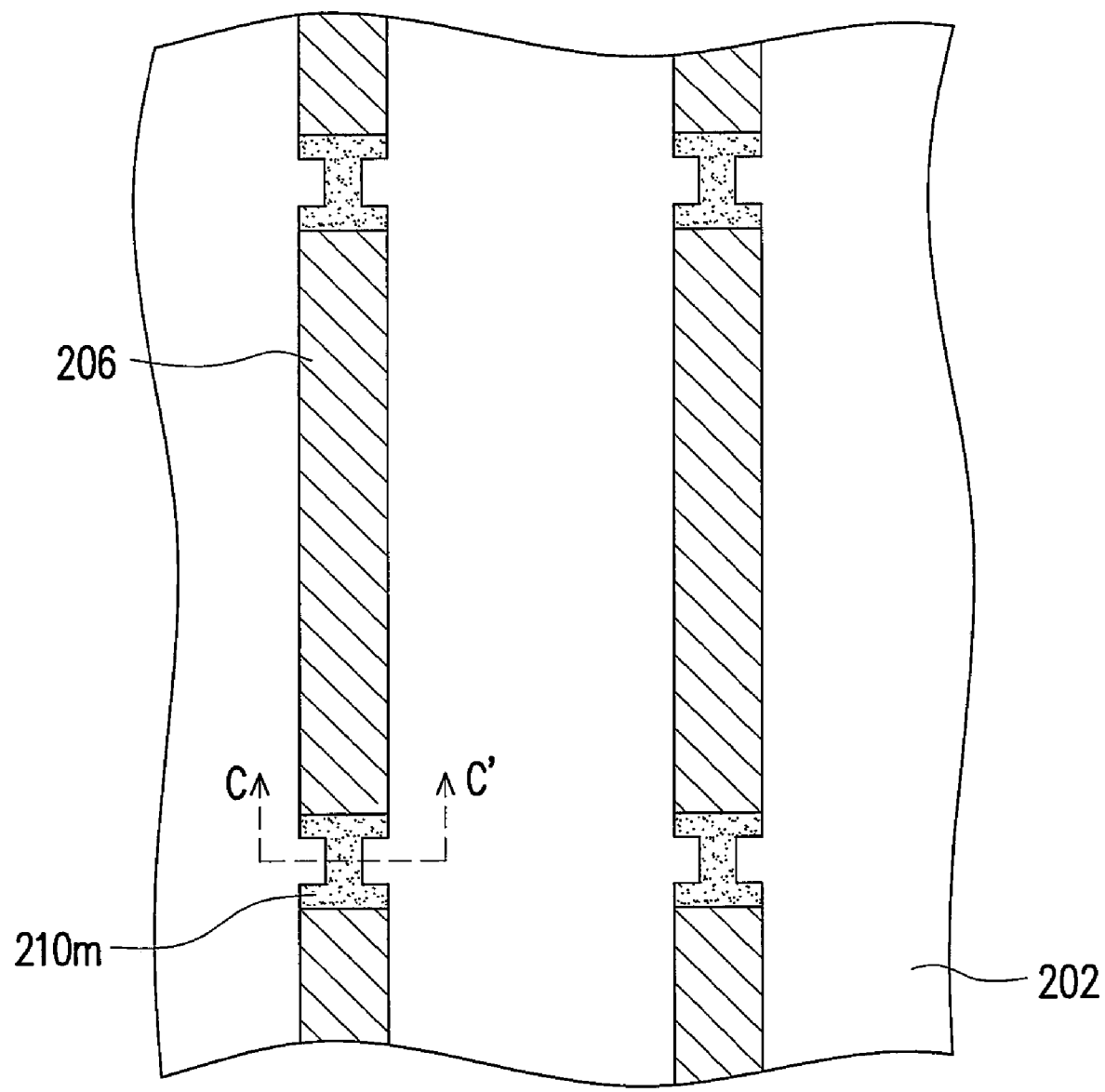
FIGS. 5A through 5F are top views illustrating a fabricating process of a pixel structure according to a second embodiment of the present invention.

FIGS. 5A through 5F are top views illustrating a fabricating process of a pixel structure according to a second embodiment of the present invention. FIGS. 6A through 6G are cross-sectional schematic views illustrating the fabricating process of the pixel structure according to the second embodiment of the present invention. Referring to FIGS. 5A and 6A, a substrate 202 is firstly provided, and a source 210s and a data line 206 electrically connected to the source 210s are formed on the substrate 202. A distinguishing feature of said structure lies in that the source 210s is in a neck shape. According to a preferred embodiment, a first ohmic contact layer 210m is further formed on the source 210s when the source 210s is formed, so as to reduce the contact resistance between the source 210s and a subsequently formed channel layer.

Figure 5B:
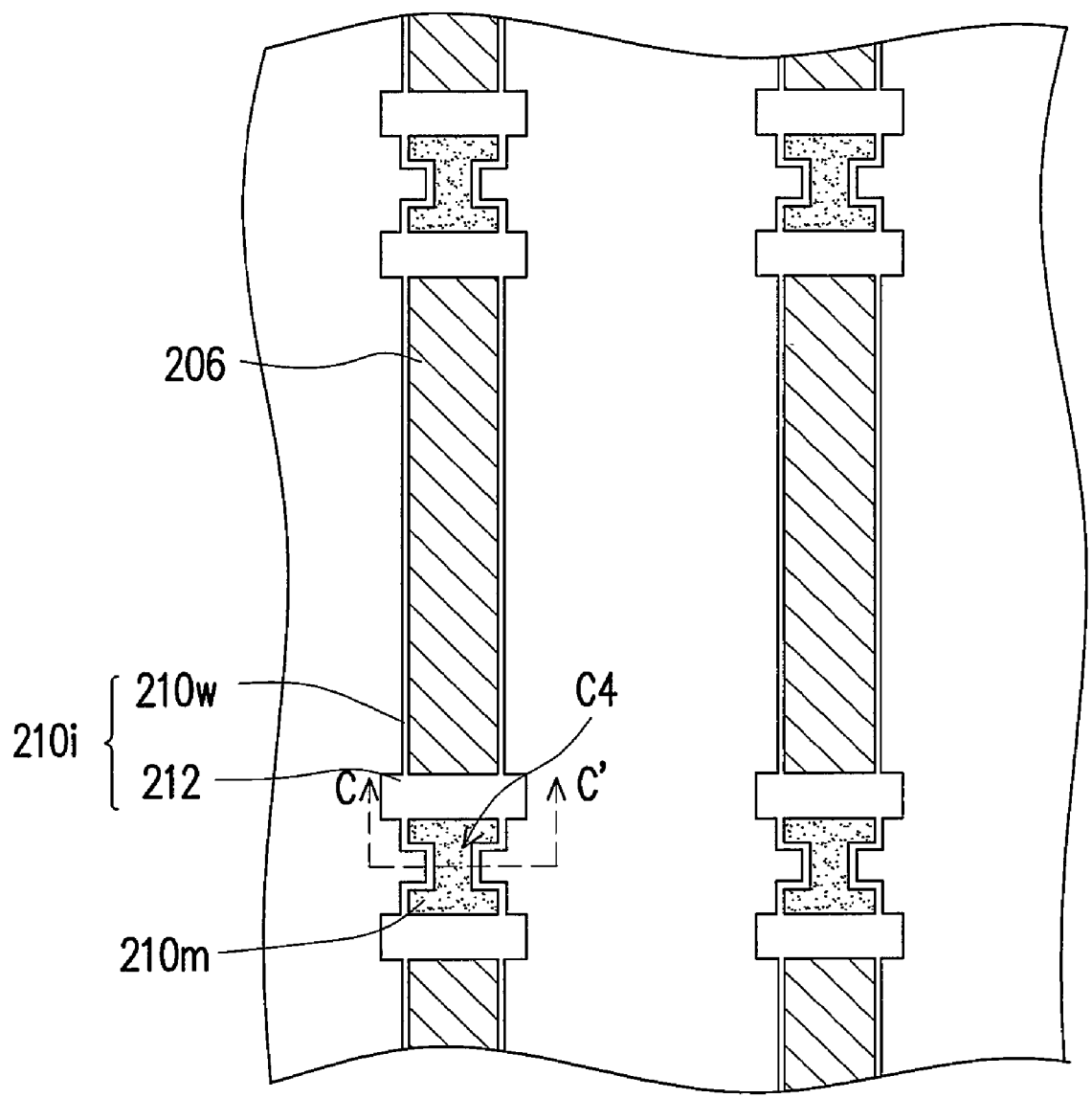
Figure 6A:
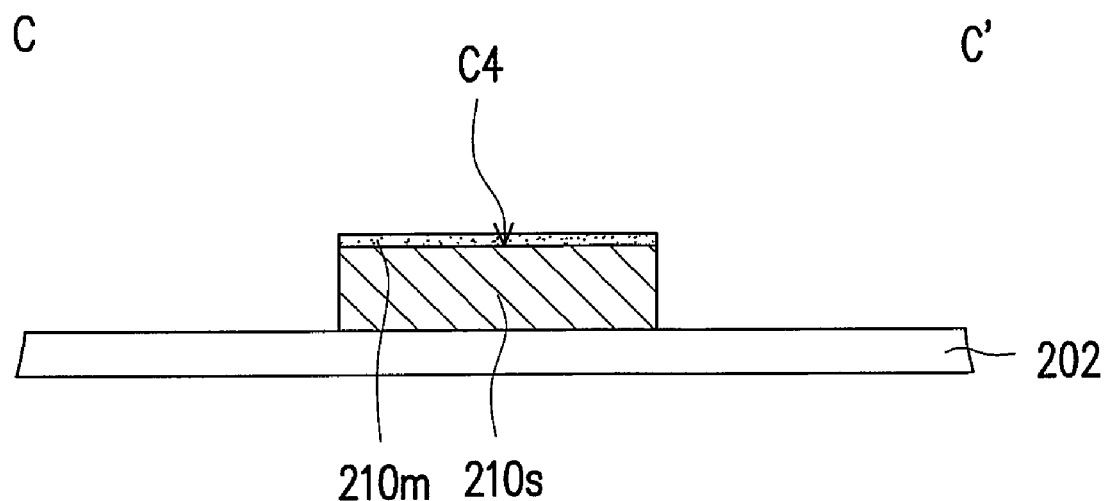
FIGS. 6A through 6G are cross-sectional schematic views illustrating the fabricating process of the pixel structure according to the second embodiment of the present invention.
Figure 6B:
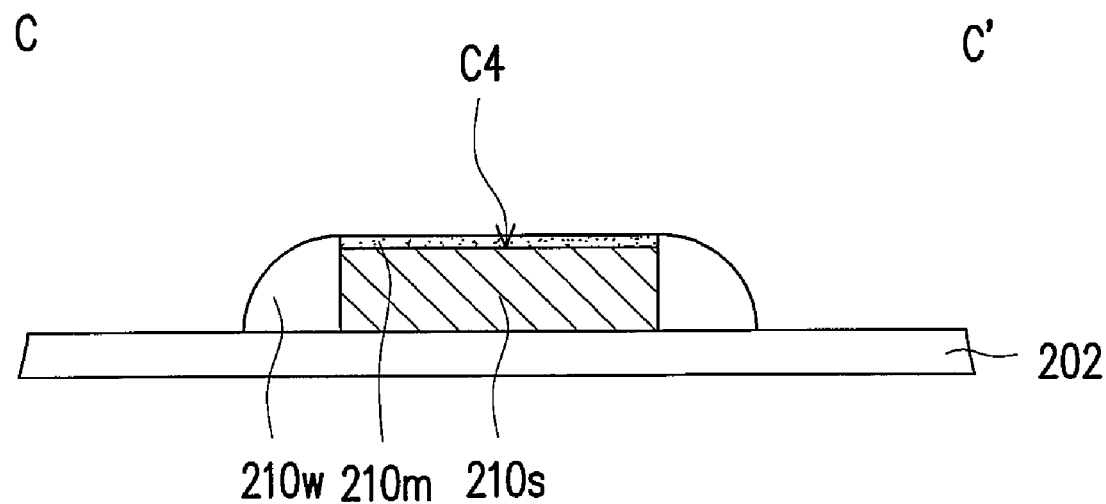

Referring to FIGS. 5B and 6B, a first insulation pattern layer 210i is then formed to cover parts of the source 210s and the substrate 202. In detail, the first insulation pattern layer 210i has a covering layer 212 and a first lateral protection wall 210w. The first lateral protection wall 210w extends on the substrate 202 at two sides of the source 210s, and the covering layer 212 covers a part of the source 210s. It should be noted that the covering layer 212 and the first lateral protection wall 210w may form an opening C4 above the source 210s. Besides, it is indicated in FIG. 6B that a thickness of the first lateral protection wall 210w is decreased in a direction away from the source 210s. Said arrangement allows film layers subsequently formed on the first lateral protection wall 210w to have desired step coverage. The first lateral protection wall 210w may also be in other profiles. The present invention is not intended to limit the profile of the first lateral protection wall 210w.

Figure 5C:
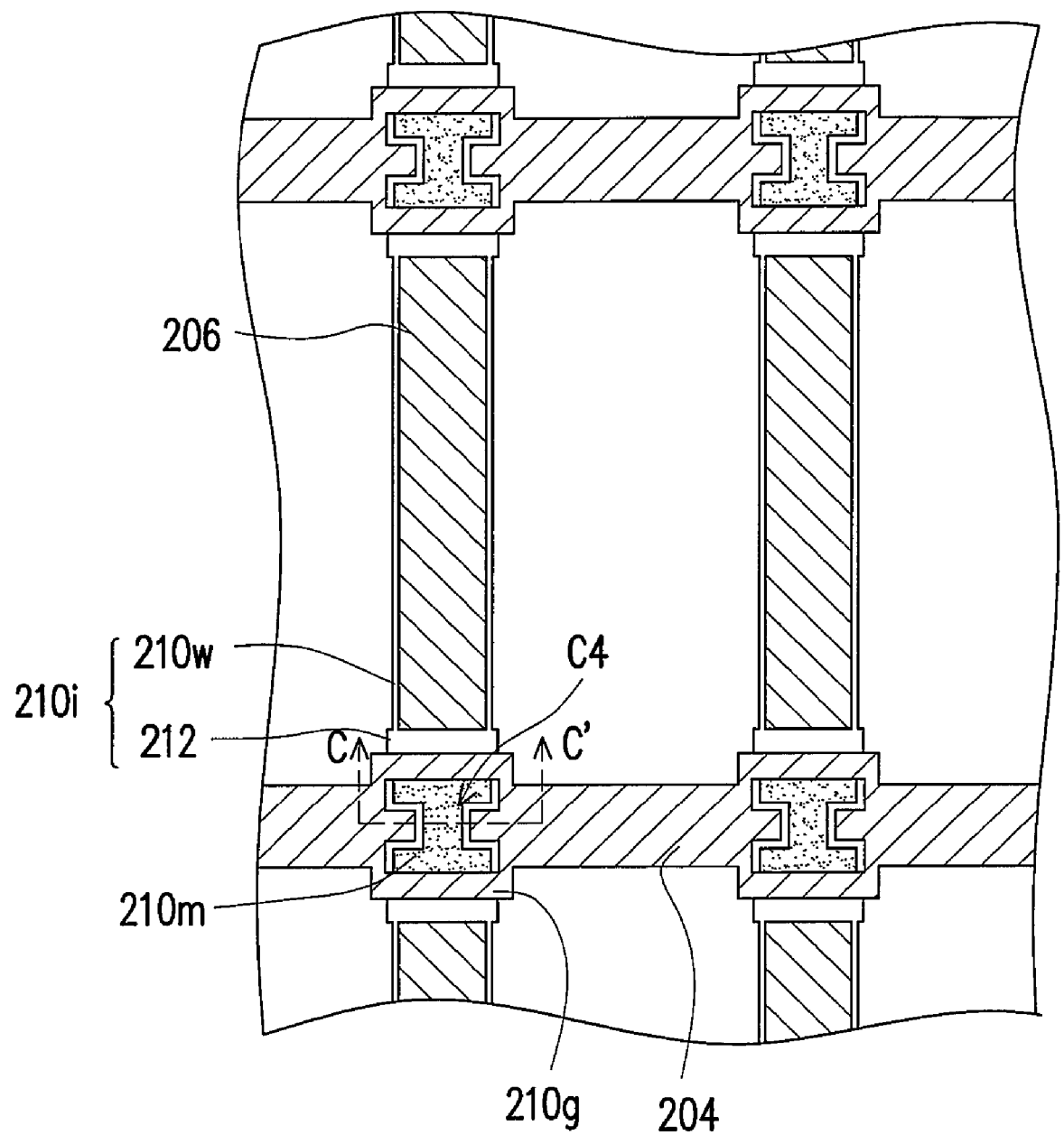
Figure 6C:
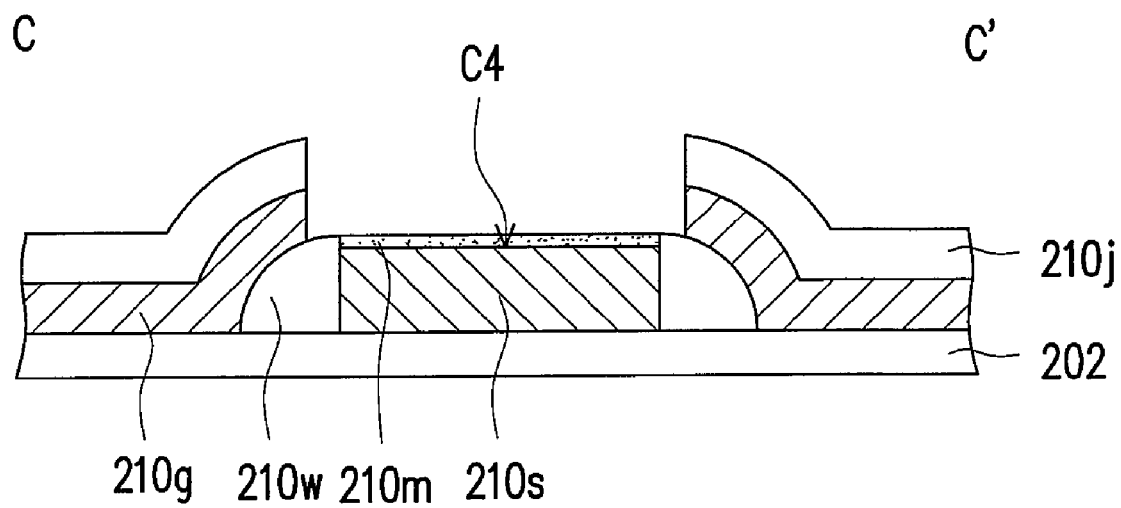

Referring to FIGS. 5C and 6C, a gate pattern layer 210g and a scan line 204 electrically connected to the gate pattern layer 210g are then formed on the first insulation pattern layer 210i, and the gate pattern layer 210g surrounds the opening C4. Particularly, the profile of the gate pattern layer 210g may correspond to that of the source 210s. Thereafter, a second insulation pattern layer 210j is formed to cover the gate pattern layer 210g and the substrate 202. As shown in FIG. 6C, the gate pattern layer 210g and the second insulation pattern layer 210j disposed thereon may together surround the opening C4. The second insulation pattern layer 210j is not depicted in FIG. 5C for the purpose of better illustration and comprehension.

Figure 5D:
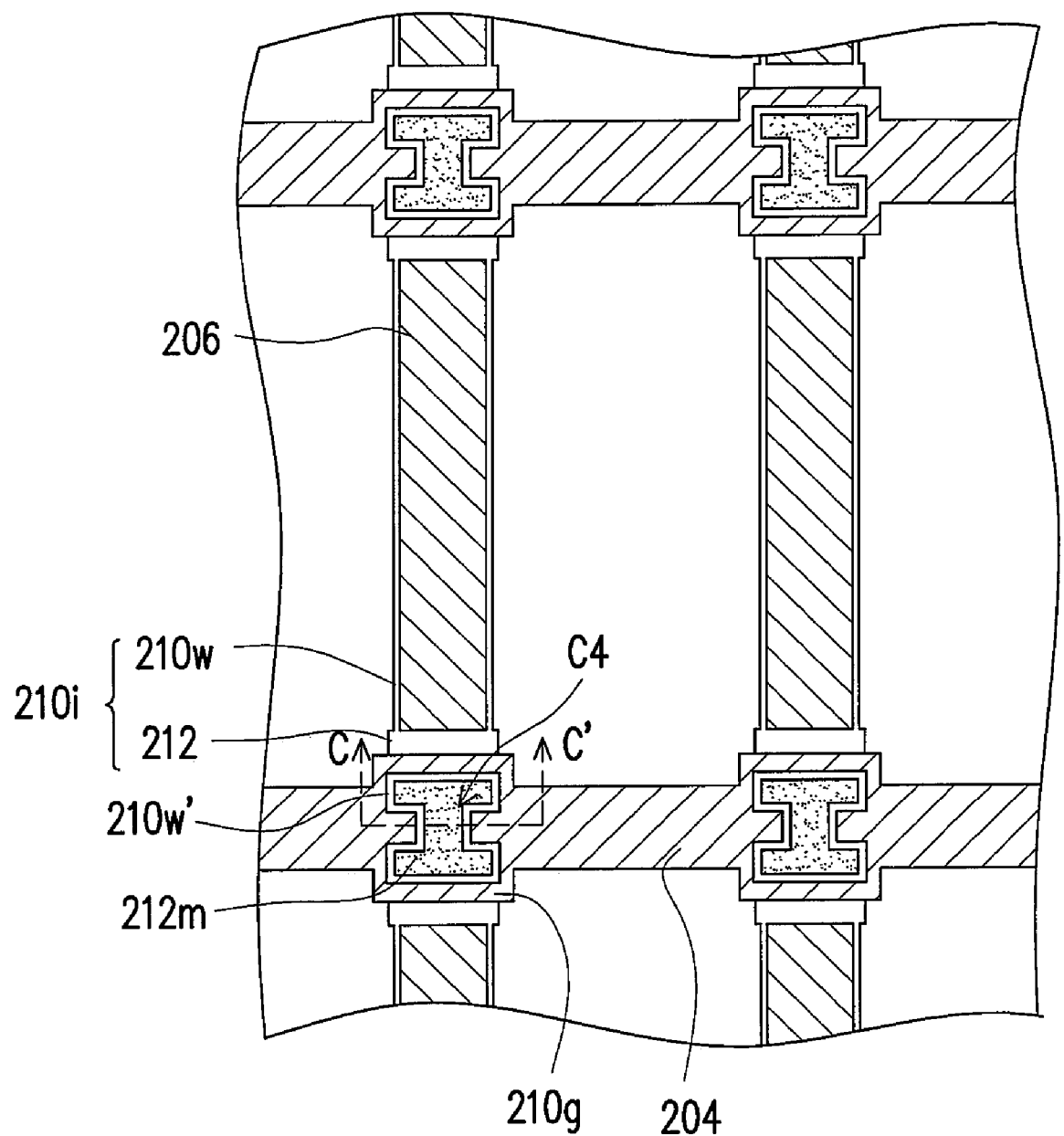
Figure 6D:
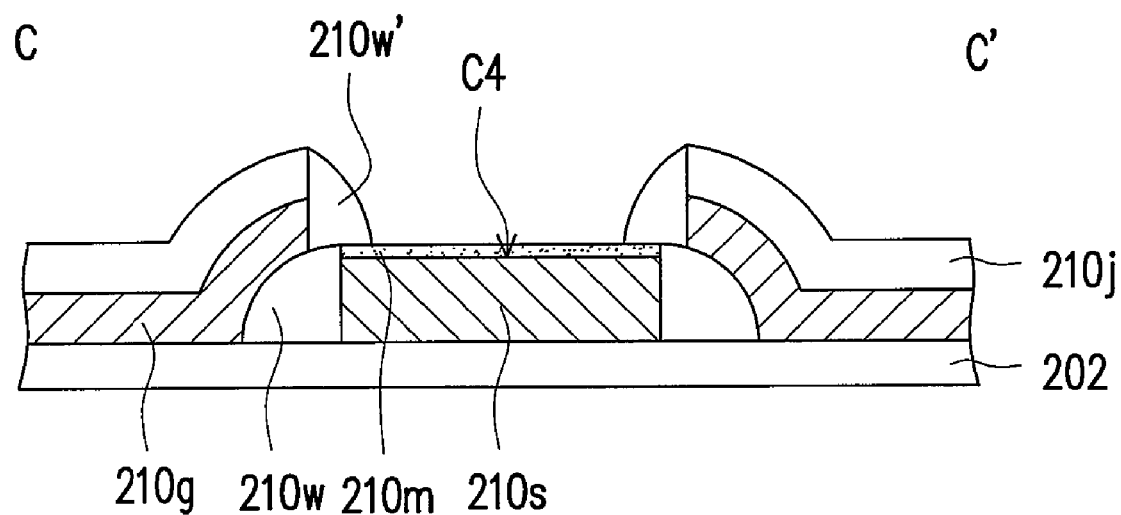

Thereafter, with reference to FIGS. 5D and 6D, at least a second lateral protection wall 210w' is formed on an edge of the gate pattern layer 210g in the opening C4. Specifically, a thickness of the second lateral protection wall 210w' is decreased in a direction towards a center of the opening C4, and a surface of the second lateral protection wall 210w' is in an arc shape, for example. The second lateral protection wall 210w' may also be in other profiles. The present invention is not intended to limit the profile of the second lateral protection wall 210w'.

Figure 5E:
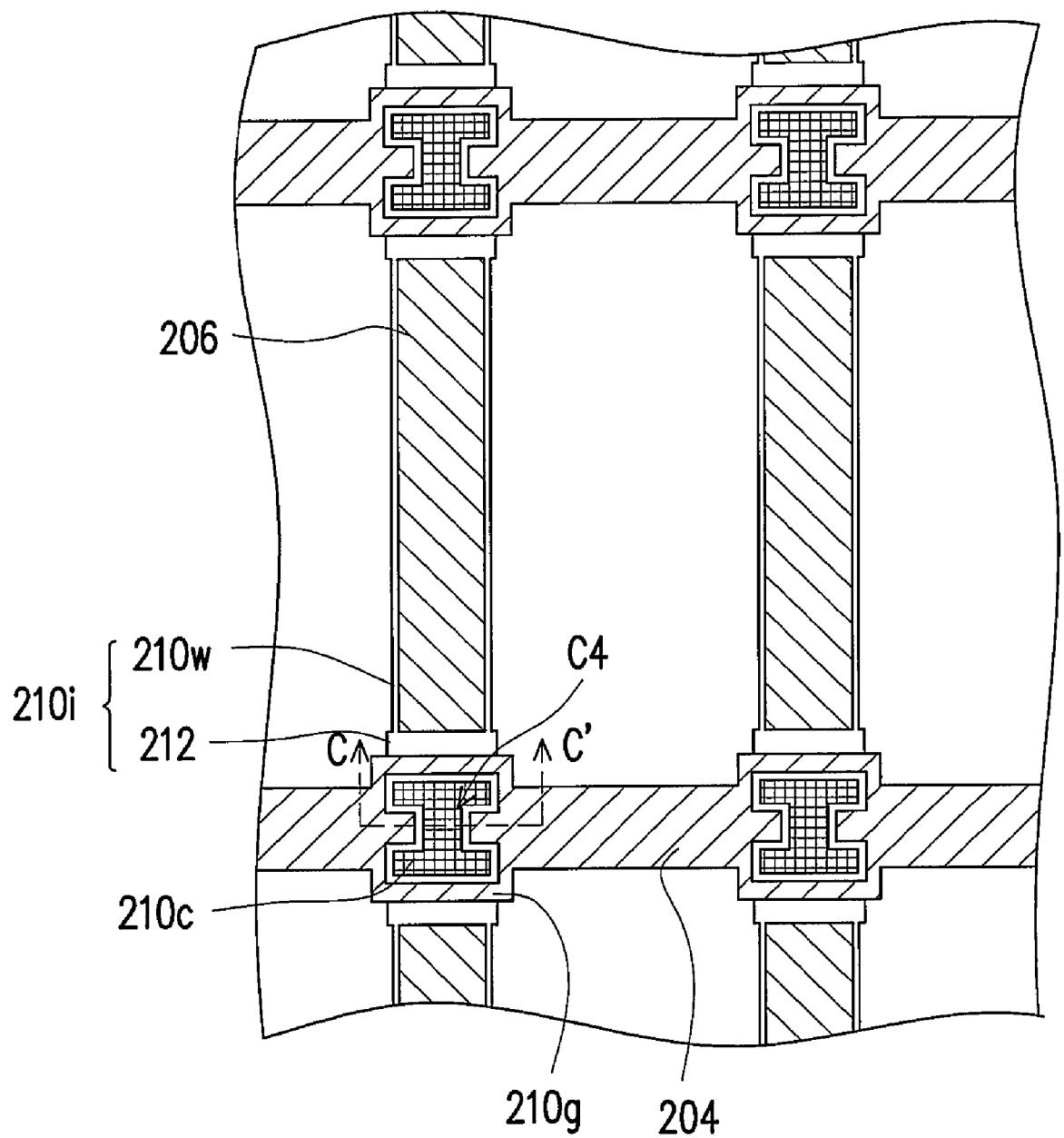
Figure 6E:
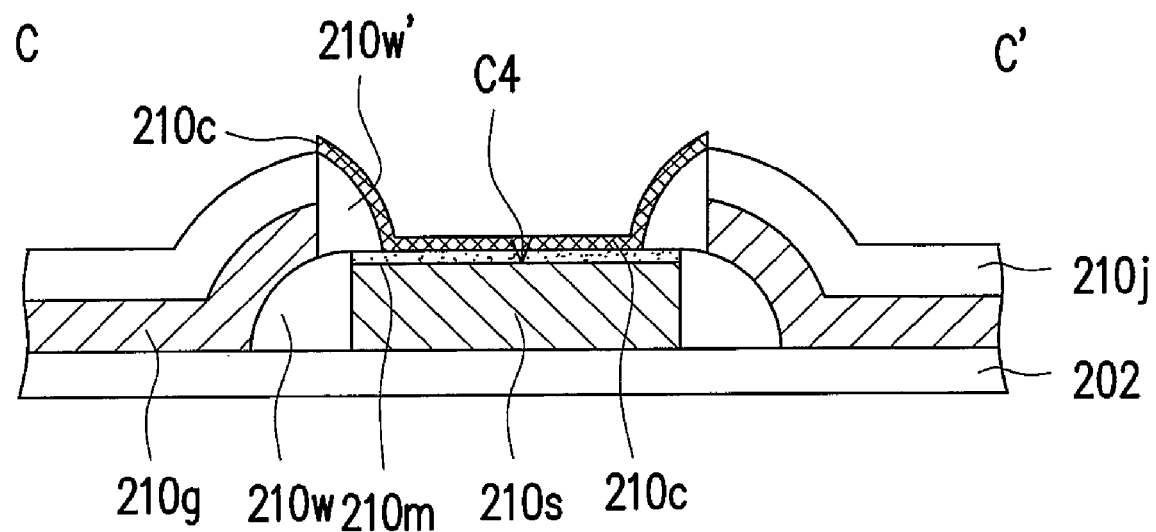

Referring to FIGS. 5E and 6E, a channel layer 210c is then formed in the opening C4 to cover the second lateral protection wall 210w' and a portion of the first ohmic contact layer 210m. Since the profiles of the channel layer 210c and the gate pattern layer 210g are changed, the channel layer 210c accordingly corresponds to the gate pattern layer 210g to a greater extent.

Figure 6F:
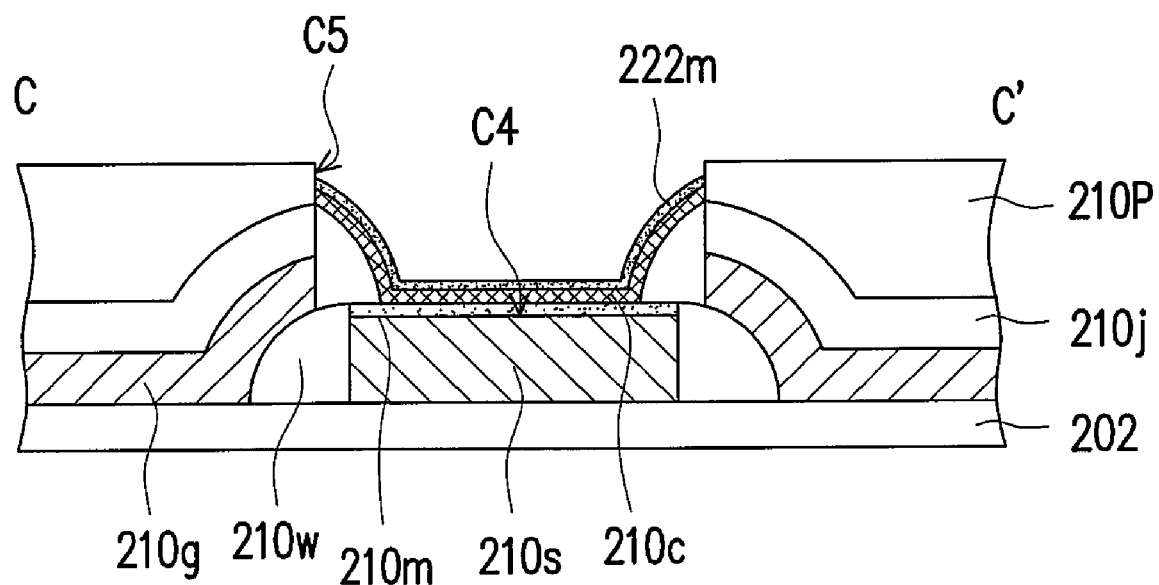

With reference to FIG. 6F, a passivation layer 210p is then formed on the channel layer 210c and the second insulation pattern layer 210j. The passivation layer 210p has a contact window C5 to expose a portion of the channel layer 210c. A second ohmic contact layer 222m may be further formed on the exposed surface of the channel layer 210c after the passivation layer 210p is formed.

Figure 5F:
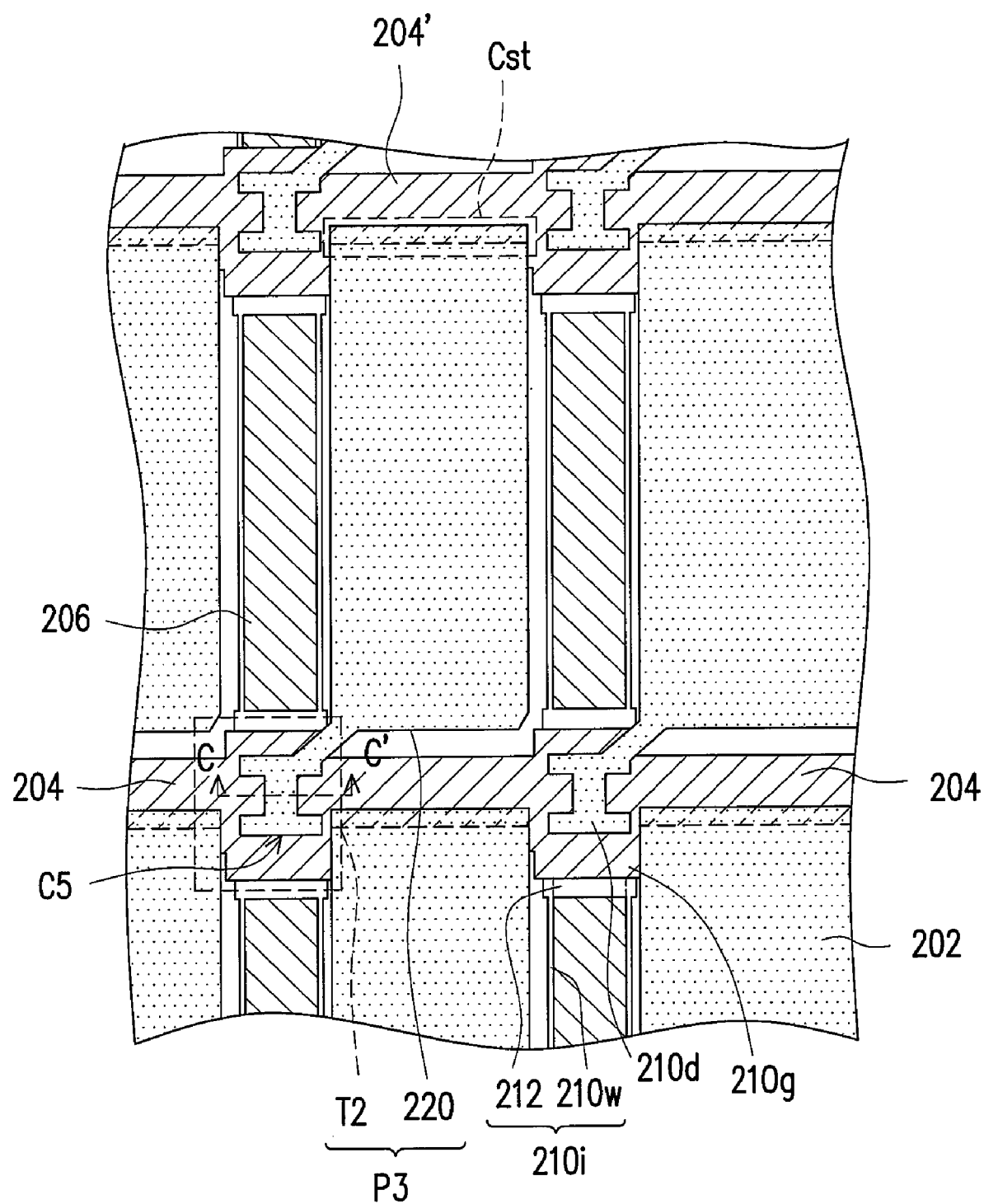
Figure 6G:
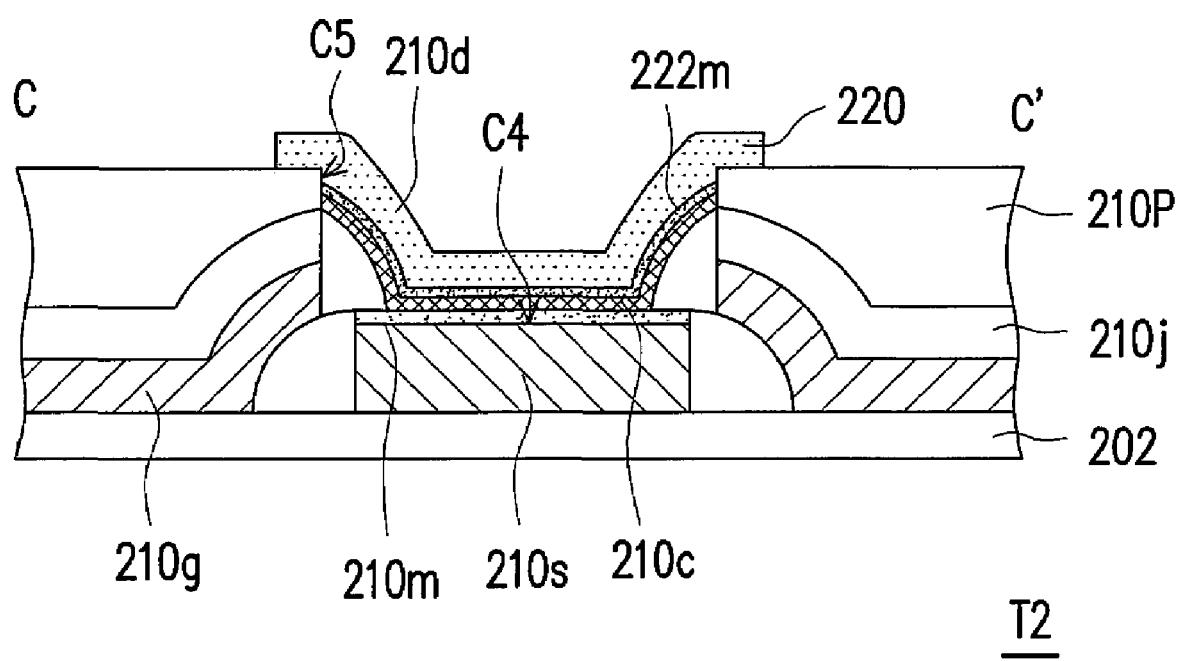

After that, referring to FIGS. 5F and 6G, a pixel electrode 220 is formed on the passivation layer 210p, and a drain 210d is formed in the contact window C5 (the passivation layer 210p is not illustrated in FIG. 5F, while the passivation layer 210p is clearly indicated in FIG. 6G). Moreover, a part of the pixel electrode 220 may extend above a previous scan line 204', so as to form a storage capacitor Cst' along with a part of the scan line 204'. Up to here, the fabrication of the pixel structure P3 and the TFT T2 thereof is completed. Since the gate pattern layer 210g corresponds to the channel layer 210c to a greater extent, the conductivity performance of the TFT T2 in the present invention may be further improved.

To sum up, a portion of the channel layer in the present invention may extend upwards through the second lateral protection wall. Therefore, no additional area on the substrate is occupied by the TFT of the present invention. Furthermore, the pixel structure may be characterized by favorable aperture ratio. On the other hand, the length of the channel layer is apt to be monitored through controlling the thicknesses of the gate and the second insulation layer. Accordingly, the fabricating method of the TFT in the present invention is capable of forming the TFT with outstanding conductivity performance. Besides, the TFT of the present invention may be formed at an intersection between the scan line and the data line, and thus the aperture ratio of the pixel structure may be further increased. Additionally, the channel layer corresponds to the gate pattern layer to a greater extent through adjusting the profiles of the gate pattern layer and the channel layer in the present invention. Thereby, the conductivity performance of the TFT in the present invention may be further improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A TFT disposed on a substrate, comprising:
   a source disposed on the substrate;
   a first insulation pattern layer covering parts of the source and the substrate, the first insulation pattern layer comprising a covering layer and a first lateral protection wall, wherein the first lateral protection wall extends on the substrate at two sides of the source, the covering layer covers a part of the source, and the covering layer and the first lateral protection wall surround and define an opening exposing a part of the source;
   a gate pattern layer and a second insulation pattern layer sequentially disposed on the first insulation pattern layer, wherein the gate pattern layer and the second insulation pattern layer surround the opening and expose a part of the source;
   a second lateral protection wall surrounding the inside of the opening and covering an edge of the gate pattern layer, wherein a thickness of the second lateral protection wall is decreased in a direction towards a center of the opening;
   a channel layer disposed on the second lateral protection wall and the source in the opening;
   a passivation layer disposed on the channel layer and the second insulation pattern layer, wherein the passivation layer has a contact window to expose a portion of the channel layer; and
   a drain disposed on the exposed portion of the channel layer.

2. The TFT as claimed in claim 1, further comprising a first ohmic contact layer disposed between the source and the channel layer.

3. The TFT as claimed in claim 1, further comprising a second ohmic contact layer disposed between the channel layer and the drain.

4. The TFT as claimed in claim 1, wherein a thickness of the first insulation pattern layer extending on the substrate at the two sides of the source is decreased in a direction away from the source.

5. A pixel structure disposed on a substrate, comprising:
   a source disposed on the substrate;
   a first insulation pattern layer covering parts of the source and the substrate, the first insulation pattern layer comprising a covering layer and a first lateral protection wall, wherein the first lateral protection wall extends on the substrate at two sides of the source, the covering layer covers a part of the source, and the covering layer and the first lateral protection wall surround and define an opening exposing a part of the source;
   a gate pattern layer and a second insulation pattern layer sequentially disposed on the first insulation pattern layer, wherein the gate pattern layer and the second insulation pattern layer surround the opening;
   a second lateral protection wall disposed on an edge of the gate pattern layer in the opening;
   a channel layer disposed on the second lateral protection wall and the source in the opening;
   a passivation layer disposed on the channel layer and the second insulation pattern layer, wherein the passivation layer has a contact window to expose a portion of the channel layer; and
   a pixel electrode and a drain disposed on the passivation layer and in the contact window, respectively, wherein the pixel electrode is electrically connected to the drain, and the drain is electrically connected to the channel layer.

6. The pixel structure as claimed in claim 5, further comprising a first ohmic contact layer at least disposed between the source and the channel layer.

7. The pixel structure as claimed in claim 5, further comprising a second ohmic contact layer disposed between the channel layer and the drain.

8. The pixel structure as claimed in claim 5, wherein a thickness of the first insulation pattern layer extending on the substrate at the two sides of the source is decreased in a direction away from the source.

9. The pixel structure as claimed in claim 5, wherein a thickness of the second lateral protection wall is decreased in a direction towards a center of the opening.

10. The pixel structure as claimed in claim 5, further comprising a data line disposed on the substrate and electrically connected to the source.

11. The pixel structure as claimed in claim 5, further comprising a scan line disposed on the substrate and electrically connected to the gate pattern layer.

* * * * *